US011935730B2

(12) United States Patent
Hudson et al.

(10) Patent No.: US 11,935,730 B2
(45) Date of Patent: Mar. 19, 2024

(54) SYSTEMS AND METHODS FOR CLEANING AN EDGE RING POCKET

(71) Applicant: Lam Research Corporation, Fremont, CA (US)

(72) Inventors: Eric Hudson, Berkeley, CA (US); Scott Briggs, Menlo Park, CA (US); John Holland, San Jose, CA (US); Alexei Marakhtanov, Albany, CA (US); Felix Leib Kozakevich, Sunnyvale, CA (US); Kenneth Lucchesi, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 240 days.

(21) Appl. No.: 17/628,862

(22) PCT Filed: Jul. 22, 2020

(86) PCT No.: PCT/US2020/043138
§ 371 (c)(1),
(2) Date: Jan. 20, 2022

(87) PCT Pub. No.: WO2021/021531
PCT Pub. Date: Feb. 4, 2021

(65) Prior Publication Data
US 2022/0254616 A1    Aug. 11, 2022

Related U.S. Application Data

(60) Provisional application No. 62/881,893, filed on Aug. 1, 2019.

(51) Int. Cl.
*H01J 37/32*    (2006.01)

(52) U.S. Cl.
CPC .. *H01J 37/32862* (2013.01); *H01J 37/32183* (2013.01); *H01J 37/3244* (2013.01);
(Continued)

(58) Field of Classification Search
CPC ........... H01J 37/32862; H01J 37/32183; H01J 37/3244; H01J 37/32642; H01J 37/32715; H01J 2237/332
See application file for complete search history.

(56) References Cited

U.S. PATENT DOCUMENTS

| 5,882,424 A | 3/1999 | Taylor et al. |
| 2008/0110859 A1 | 5/2008 | Koshiishi et al. |

(Continued)

OTHER PUBLICATIONS

ISR & Written Opinion PCT/US2020/043138, dated Jul. 22, 2020, 7 pages.

*Primary Examiner* — Wei (Victor) Y Chan
(74) *Attorney, Agent, or Firm* — PENILLA IP, APC

(57) ABSTRACT

Systems and methods for cleaning an edge ring pocket are described herein. One of the methods includes providing one or more process gases to a plasma chamber, supplying a low frequency (LF) radio frequency (RF) power to an edge ring that is located adjacent to a chuck of the plasma chamber. The LF RF power is supplied while the one or more process gases are supplied to the plasma chamber to maintain plasma within the plasma chamber. The supply of the LF RF power increases energy of plasma ions near the edge ring pocket to remove residue in the edge ring pocket. The LF RF power is supplied during the time period in which a substrate is not being processed within the plasma chamber.

20 Claims, 18 Drawing Sheets

(52) U.S. Cl.
CPC .. *H01J 37/32642* (2013.01); *H01J 37/32715* (2013.01); *H01J 2237/332* (2013.01); *H01J 2237/334* (2013.01)

(56) References Cited

U.S. PATENT DOCUMENTS

| | | |
|---|---|---|
| 2008/0314408 A1 | 12/2008 | Jeong et al. |
| 2015/0228463 A1 | 8/2015 | Manna et al. |
| 2018/0082822 A1 | 3/2018 | Kellogg et al. |
| 2020/0144034 A1* | 5/2020 | Yokoyama ........ H01J 37/32642 |

* cited by examiner (PER WAC – no power to chuck)

(PER WAC – power to chuck)

(Pocket)

(Pressure achieves steady state)

(Strike Plasma)

(Power Ramp Down)

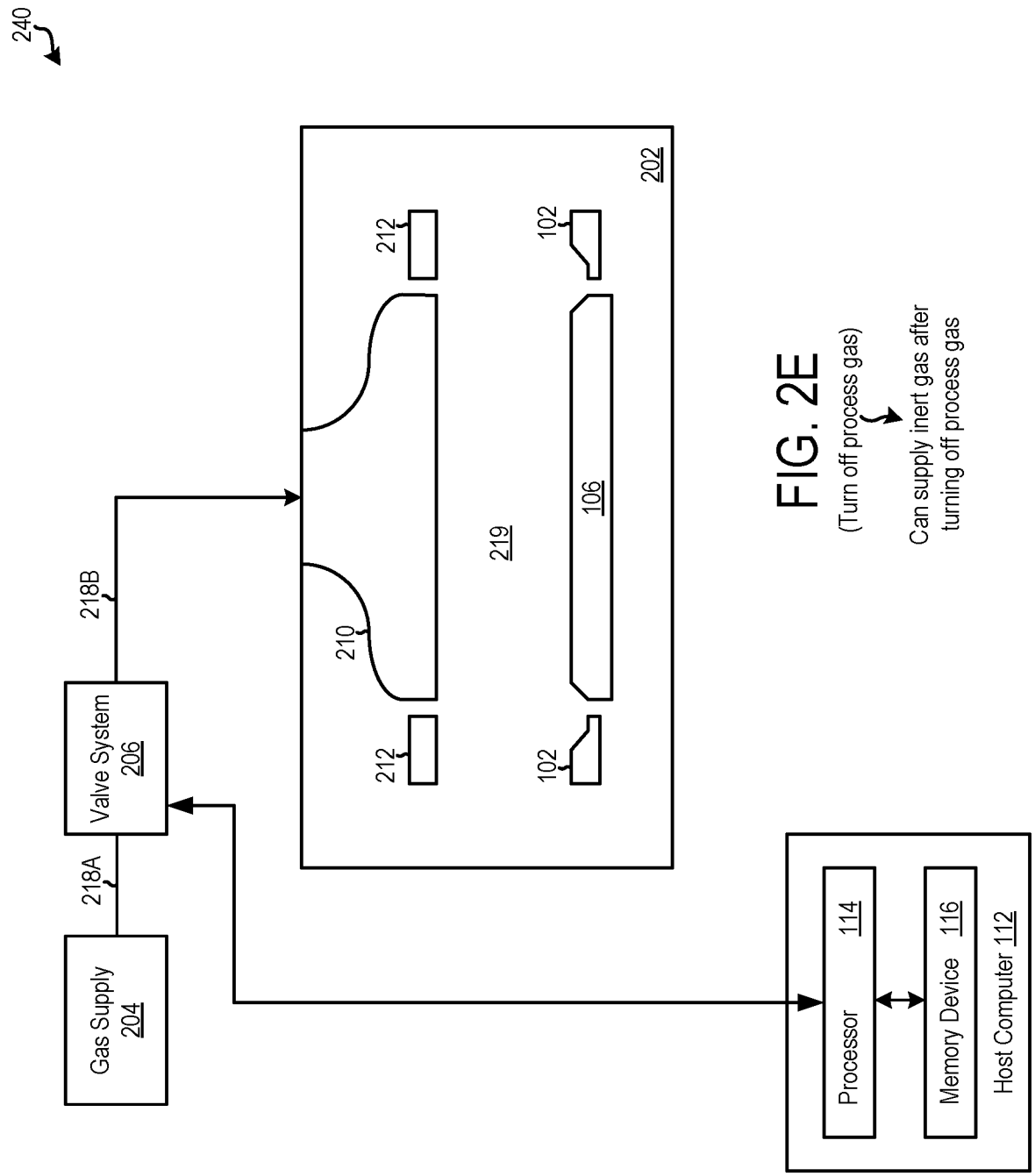

(CWAC followed by PER WAC)

(CWAC followed by pins-up auto clean)

(CWAC followed by pins-up auto clean)

(Process S2) → To FIG. 7B (Clean using PER WAC)
→ To FIG. 7C (Process S3) → To FIG. 7D (Clean using PER WAC)

SYSTEMS AND METHODS FOR CLEANING AN EDGE RING POCKET

CLAIM OF PRIORITY

This application is a national stage filing of and claims priority, under 35 U.S.C. § 371, to PCT/US2020/043138, filed on Jul. 22, 2020, and titled "SYSTEMS AND METHODS FOR CLEANING AN EDGE RING POCKET", which claims the benefit of and priority, under 35 U.S.C. § 119(e), to U.S. Provisional Patent Application No. 62/881,893, filed on Aug. 1, 2019, and titled "SYSTEMS AND METHODS FOR CLEANING AN EDGE RING POCKET", both of which are incorporated by reference herein in their entirety.

FIELD

The embodiments described in the present disclosure relate to systems and methods for cleaning an edge ring pocket.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, one or more radio frequency (RF) generators are coupled to an impedance matching network. The impedance matching network is coupled to a plasma chamber. RF signals are supplied from the RF generators to the impedance matching network. The impedance matching network outputs an RF signal upon receiving the RF signals. The RF signal is supplied from the impedance matching circuit to the plasma chamber for processing a wafer in the plasma chamber.

After a certain amount of time for which one or more wafers are processed in the plasma chamber, unwanted materials are deposited on surfaces of various parts of the plasma chamber. If the parts are not cleaned, the materials build up further on the parts and the build-up negatively affects efficiency in processing the wafers. Also, some cleaning processes for removing the build-up take too long or are not effective in removing the materials.

It is in this context that embodiments described in the present disclosure arise.

SUMMARY

Embodiments of the disclosure provide apparatus, methods and computer programs for cleaning an edge ring pocket. It should be appreciated that the present embodiments can be implemented in numerous ways, e.g., a process, an apparatus, a system, a piece of hardware, or a method on a computer-readable medium. Several embodiments are described below.

In one embodiment, a method for cleaning an edge ring pocket is described. The method includes providing one or more process gases to a plasma chamber and supplying a low frequency (LF) radio frequency (RF) power to an edge ring that is located adjacent to a chuck of the plasma chamber. A portion of the edge ring pocket is defined by a top surface of the edge ring. The operation of supplying the LF RF power is performed while the one or more process gases are supplied to the plasma chamber to maintain plasma within the plasma chamber. Moreover, the operation of supplying the LF RF power is performed during a time period in which RF power is not supplied to the chuck. Also, the operation of supplying the LF RF power energizes plasma ions in the plasma to remove residue in the edge ring pocket. The operation of supplying the LF RF power is performed during the time period in which a substrate is not being processed within the plasma chamber.

In an embodiment, a method for cleaning an edge ring pocket is described. The method includes providing one or more process gases to a plasma chamber. The method further includes supplying LF RF power to an edge ring that is located adjacent to a chuck of the plasma chamber. A portion of the edge ring pocket is defined by a top surface of the edge ring. The method further includes supplying high frequency (HF) RF power to the chuck. The operation of supplying the LF RF power and supplying the HF RF power are performed while the one or more process gases are supplied to the plasma chamber to maintain plasma within the plasma chamber. Also, the operation of supplying the LF RF power energizes plasma ions in the plasma to remove residue in the edge ring pocket. The operation of supplying the LF RF power and supplying the HF RF power are performed during a time interval in which a substrate is not being processed within the plasma chamber.

In one embodiment, a method for cleaning an edge ring pocket is described. The method includes providing one or more process gases to a plasma chamber and supplying LF RF power to an edge ring that is located adjacent to a chuck of the plasma chamber. A portion of the edge ring pocket is defined by a top surface of the edge ring. The method further includes supplying HF RF power to the chuck for a predetermined portion of a time period during which the LF RF power is supplied to the edge ring. The operation of supplying the LF RF power is performed while the one or more process gases are supplied to the plasma chamber to maintain plasma within the plasma chamber. Also, the operation of supplying the LF RF power energizes plasma ions in the plasma to remove residue in the edge ring pocket. The operation of supplying the LF RF power is performed during the time period in which a substrate is not being processed within the plasma chamber.

Some advantages of the herein described systems and methods for cleaning the edge ring pocket include increasing an efficiency in reducing or removing residue that is deposited within the edge ring pocket. There is an increased removal rate compared to other conventional methods. For example, when the methods, described herein, are applied, the removal rate increases by two or more times. To illustrate, the residue within the edge ring pocket is removed at a rate of 1.5 micrometers per minute. As another illustration, the residue within the edge ring pocket is removed at a rate of 1.6 micrometers per minute. As yet another illustration, the residue within the edge ring pocket is removed at a rate between 1.4 micrometers per minute and 2 micrometers per minute.

Also, the residue is removed more effectively compared to other conventional methods. The residue deposited within the edge ring pocket is completely removed or a substantial amount of the residue is removed by application of the method for cleaning the edge ring pocket, described herein. As an example, the residue is completely or substantially removed by applying the methods, described herein, for cleaning the edge ring pocket for approximately 3 RF hours. To illustrate, the residue is completely or substantially removed by applying the methods for a time period that ranges between 2 hours and 45 minutes to 3 hours and 15 minutes. As another illustration, a greater amount of residue is removed from the edge ring pocket compared to an amount removed from the edge ring pocket by applying power to a chuck without applying power to an edge ring. The complete or substantial amount of removal of the residue and the increase in the efficiency are achieved by applying a greater amount of power to the edge ring compared to that applied to the chuck. Sometimes, the complete or substantially complete removal of the residue is determined by visual inspection by a user of the edge ring pocket.

In addition, to clean the edge ring pocket, one or more process gases that are applied are less harmful to the chuck and the edge ring compared to those applied during conventional methods. For example, a lower amount of fluorine is applied to clean the edge ring pocket than that applied during a waferless auto clean operation. During the waferless auto clean operation, power is applied to the chuck without applying power to the edge ring and the greater amount of fluorine is supplied within a plasma chamber. The lower amount of fluorine does not wear or minimally wears components of the plasma chamber.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 2E is a diagram of an embodiment of a system to illustrate a sub-operation of turning off a supply of one or more process gases for cleaning the edge ring pocket and the gap.

DETAILED DESCRIPTION

The following embodiments describe systems and methods for cleaning an edge ring pocket. It will be apparent that the present embodiments may be practiced without some or all of these specific details. In other instances, well known process operations have not been described in detail in order not to unnecessarily obscure the present embodiments.

Figure 1A:
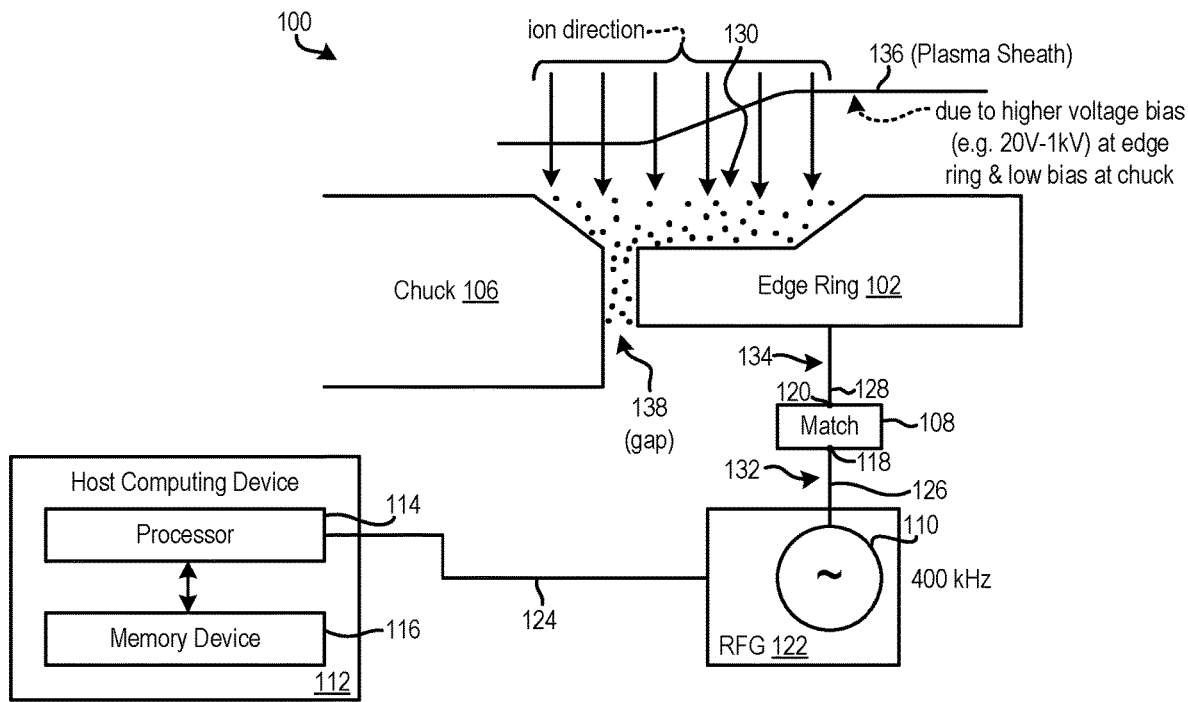
FIG. 1A is a diagram of an embodiment of a system for illustrating an application of radio frequency (RF) power to an edge ring to clean an edge ring pocket and clean a gap without applying any RF power to a chuck.

FIG. 1A is a diagram of an embodiment of a system 100 for illustrating an application of radio frequency (RF) power to an edge ring 102 to clean an edge ring pocket 130 and a gap 138 without applying any RF power to a chuck 106. The system 150 is used to illustrate a powered edge ring (PER) wafer auto clean (WAC) operation without providing power to the chuck 106. The system 100 includes the edge ring 102, the chuck 106, an impedance matching circuit 108, an RF generator 122, and a host computing device 112. The RF generator 122 includes an RF power supply 110. The host computing device 112 includes a processor 114 and a memory device 116.

Examples of the host computing device 112 include a computer, a server, a tablet, a smart phone, a desktop computer, and a laptop computer. Also, examples of the memory device 116 include a random access memory (RAM) and a read-only memory (ROM). To illustrate, the memory device 116 is a flash memory, a non-volatile memory, a static random access memory, a dynamic random access memory, or a programmable read-only memory.

Examples of a processor, as described herein, include a microprocessor, a microcontroller, one or more controllers, a combination of a processor and one or more controllers, a central processing unit, an application specific integrated circuit (ASIC), and a programmable logic device (PLD).

An example of an RF power supply, described herein, includes an electronic oscillator that produces a periodic oscillating electronic signal, such as a sine wave or a square wave. To illustrate, the RF power supply 110 produces signals in a low frequency (LF) RF range from 400 kilohertz (kHz) to 27 MHz (MHz). As another illustration, the RF power supply 110 does not generate an RF signal having a frequency that is 60 MHz. To further illustrate, the RF power supply 110 produces an RF signal having a frequency of 400 kHz. The RF signal has the frequency of 400 kHz when the RF signal oscillates at a frequency that ranges within a predetermined range from 400 kHz, such as between 395 kHz and 405 kHz. Similarly, as another illustration, the RF power supply 110 produces an RF signal having a frequency of 2 MHz or 13.56 MHz or 27 MHz. For example, the RF signal has the frequency of 2 MHz when the RF signal oscillates at a frequency that ranges within a predetermined range from 2 MHz, such as between 1.98 MHz and 2.2 MHz. An example of the electronic oscillator includes a transistor and an operational amplifier.

An impedance matching circuit, described herein, includes one or more circuit components, e.g., one or more inductors, or one or more capacitors, or one or more resistors, or a combination or two or more thereof, etc., which are coupled with each other. For example, the impedance matching circuit 108 includes a series capacitor that is coupled in series to an end of an inductor, and further includes a shunt capacitor having an end that is coupled between an input 118 of the impedance matching circuit 108 and the series capacitor. Another end of the shunt capacitor is coupled to a ground connection. Another end of the inductor is coupled to an output 120 of the impedance matching circuit 108.

The edge ring 102 is fabricated from one or more materials, examples of which include crystal silicon, polycrystalline silicon, silicon carbide, quartz, aluminum oxide, aluminum nitride, and silicon nitride. The edge ring 102 performs many functions, including positioning a substrate on the chuck 106 for being processed and shielding underlying components, of a plasma chamber, not protected by the substrate from being damaged by ions of plasma formed within the plasma chamber. The plasma chamber, further described below, includes the chuck 106 and the edge ring 102.

An example of the chuck 102 includes an electrostatic chuck (ESC). The chuck 102 includes a lower electrode. The chuck 102 may be supported on a base plate, which includes a pedestal base and a facility plate. The facility plate is mounted on top of the pedestal base and the chuck 102 is mounted on top of the facility plate. The chuck 102 is fabricated from a metal, such as anodized aluminum or an alloy of aluminum.

The processor 114 is coupled to the memory device 116 and is coupled via a connection cable 124 to the RF generator 122. As an example, the processor 114 is coupled to a digital signal processor (DSP) of the RF generator 122 and the digital signal processor of the RF generator 122 is coupled to the RF power supply 110. An example of a connection cable, described herein, includes a parallel transfer cable to achieve a parallel transfer of data between the RF generator 122 and the processor 114, or a serial transfer cable to achieve a serial transfer of data between the RF generator 122 and the processor 114, or a universal serial bus (USB) cable.

Moreover, an output of the RF power supply 110 is coupled to the input 118 of the impedance matching circuit 108 via an RF cable 126. The output 120 of the impedance matching circuit 108 is coupled to the edge ring 102 via an RF connector 128, such as a pin or an RF cable. An example of the RF connector 128 includes a coaxial cable that is surrounded by a sleeve. The sleeve insulates the coaxial cable from electrical fields that are around the coaxial cable. Another example of the RF connector 128 is a pin that is surrounded by a sleeve.

When one or more process gases, described below, are supplied to the plasma chamber, the processor 114 generates an initiate-power-supply instruction having values of parameters, such as frequency and power, and provides the initiate-power-supply instruction via the connection cable 124 to the RF generator 122. Upon receiving the initiate-power-supply instruction, the RF generator 122 generates an RF signal 132 having the frequency and power and supplies the RF signal 132 to the input 118 of the impedance matching circuit 108. An example of the RF signal 132 is a continuous wave signal. The impedance matching circuit 108 matches an impedance of a load coupled to the output 120 of the impedance matching circuit 108 with an impedance of a source coupled to the input 118 of the impedance matching circuit 108 to output a modified RF signal 134. An example of the load coupled to the output 120 includes the edge ring 102 and the RF connector 128. An example of the source includes the RF cable 126 and the RF generator 122.

The edge ring 102 receives the modified RF signal 134 via the RF connection 128 to be powered by the modified RF signal 134 to clean the edge ring pocket 130 and the gap 138. The edge ring pocket 130 and the gap 138 include residue, such as remnants of plasma and other materials, generated during processing of the substrate within the plasma chamber. Examples of the other materials include remnants of liquid or gas materials that are used for depositing one or more layers on the substrate or remnants of portions of the substrate that is etched or a combination thereof.

When the edge ring 102 is powered by the modified RF signal 134, plasma is stricken and/or maintained within the plasma chamber. The plasma within the plasma chamber has a plasma sheath boundary 136. The plasma sheath boundary 136 is of a plasma sheath, which is a region between a surface of a component of the plasma chamber and bulk plasma. Also, when the edge ring 102 is powered by the modified RF signal 134, energy of ions of the plasma increases or the ions are energized and a greater number of the ions are directed towards edge ring pocket 130 as indicated by arrows pointing towards the edge ring pocket 130. The energy of ions increases compared to a covered wafer auto clean (CWAC) operation and there is the increase in the number of ions compared the CWAC operation. As an example, an amount of power flux, which is a product of flux of the plasma ions and mean energy of the ions is approximately double compared to an amount of power flux that is generated during the CWAC operation. To further illustrate, the amount of power flux is double compared to the amount of power flux generated during the CWAC operation. The increase in the power flux compared to that during the CWAC operation increases efficiency in cleaning the residue in the edge ring pocket 130 by approximately double compared to the CWAC operation. For example, the increase in the power flux achieves a rate of removal that is double compared to that achieved during the CWAC operation. The plasma is used to remove or reduce the residue deposited on the edge ring pocket 130 to clean the edge ring pocket 130. The plasma is also used to remove or reduce the residue within the gap 138 to clean the gap 138.

It should be noted that the plasma sheath boundary 136 moves away from the edge ring 102 compared to when the edge ring 102 is not supplied the RF power from the modified RF signal 134 and when the chuck 106 is supplied RF power. Also, the plasma sheath boundary 136 is also further away from the edge ring 102 compared to the chuck 106. For example, a perpendicular distance between the plasma sheath boundary 136 and the edge ring 102 is greater than a perpendicular distance between the plasma sheath boundary 136 and the chuck 106. The plasma sheath boundary 136 moves away from the edge ring 102 as a result of greater voltage bias at the edge ring 102 compared to a voltage bias of the chuck 106. The supply of RF power to the edge ring 102 increases the voltage bias at the edge ring 102 compared to the voltage bias at the chuck 106. An example of the voltage bias at the edge ring 102 includes a bias that is between 20 volts (V) and 1 kilovolt (kV). Also, the voltage bias at the edge ring 102 increases with a decrease in frequency of the RF signal 132 that is supplied by the RF generator 122.

It should be noted that no RF power is being supplied to the chuck 106 during a time period in which the modified RF signal 134 is being supplied to the edge ring 102. For example, the processor 114 does not send an initiate-power-supply instruction to an RF generator, described below, for generating an RF signal. The RF generator is coupled via an impedance matching circuit, described below, to the chuck 106.

It should further be noted that a substrate is not being processed within the plasma chamber when the modified RF signal 134 is being supplied to the edge ring 102. For example, during the time period in which the modified RF signal 134 is supplied to the edge ring 102, there is no processing of the substrate within the plasma chamber. Examples of processing the substrate include etching the substrate, cleaning the substrate, depositing materials on the substrate, and sputtering the substrate, etc.

In one embodiment, the terms impedance matching circuit, impedance match, match, impedance matching network, and match circuit are used herein interchangeably.

In an embodiment, instead of the continuous wave RF signal 132, a pulsed RF signal is generated by the RF power supply 110. The pulsed RF signal has multiple states, such as two or more states. State information, such as a logic level for each state, is provided by the processor 114 to the RF generator 122. In addition, frequency level and power level for each state is provided by the processor 114 to the RF generator 122. The DSP of the RF generator 122 receives the state information, the power levels, and the frequency levels for the multiple states. The DSP determines a first state from the multiple states based on the state information and provides the power level for the first state and the frequency level for the first state to the RF power supply 110 of the RF generator 122. Similarly, the DSP determines a second state from the multiple states based on the state information and provides the power level for the second state and the frequency level for the second state to the RF power supply 110 of the RF generator 122. The RF power supply 110 generates a pulsed RF signal having the multiple states and each state of the RF signal has the corresponding power level and the corresponding frequency level. For example, the pulsed RF signal generated by the RF power supply 110 transitions from the power level for the first state to the power level for the second state during a first transition time and transitions from power level for the second state to the power level for the first state during a second transition time. As an example, a transition time is a duration of time in which a parameter level, such as frequency level or power level, changes or transitions or ramps to another parameter level. To illustrate, the duration of time is associated with defined ramps of set points of frequency and power. The set points are achieved during the duration of time.

Figure 1B:
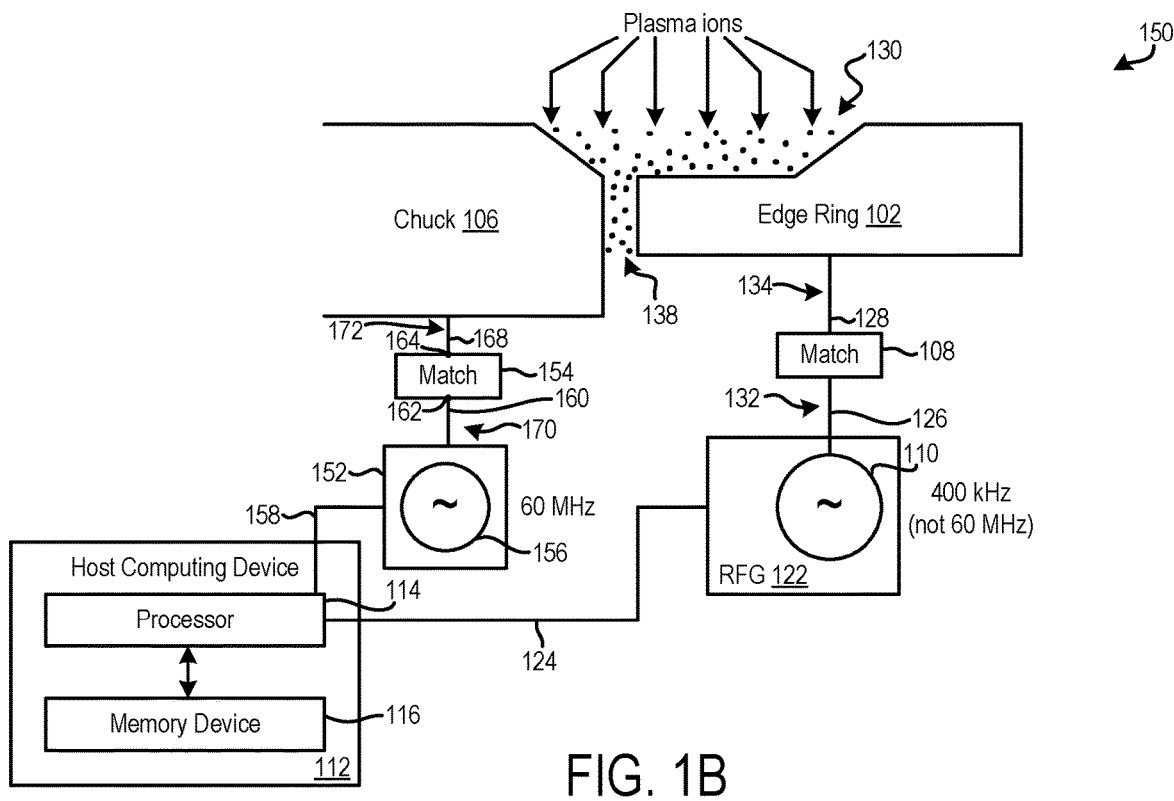
FIG. 1B is a diagram of an embodiment of a system to illustrate that RF power is simultaneously supplied to the chuck and the edge ring to clean the edge ring pocket and the gap.

FIG. 1B is a diagram of an embodiment of a system 150 to illustrate that RF power is simultaneously supplied to the chuck 106 and the edge ring 102 to clean the edge ring pocket 130 and the gap 138. The system 150 is used to illustrate a PER WAC operation in addition to providing power to the chuck 106. The system 150 is the same as the system 100. Moreover, the system 150 includes an RF generator 152 and an impedance matching circuit 154.

The processor 114 is coupled via a connection cable 158 to the RF generator 152. As an example, the processor 114 is coupled to a DSP of the RF generator 152 and the DSP of the RF generator 152 is coupled to an RF power supply 156 of the RF generator 152. The RF power supply 156 of the RF generator 152 is coupled via an RF cable 160 to an input 162 of the impedance matching circuit 154. An output 164 of the impedance matching circuit 154 is coupled via an RF transmission line 168 to the lower electrode of the chuck 106. An example of the RF transmission line 168 includes a cable that is surrounded by a sheath. There is an insulator between the sheath and the cable.

When one or more process gases, described below, are supplied to the plasma chamber, the processor 114 generates an initiate-power-supply instruction having values of the parameters, such as frequency and power, and provides the initiate-power-supply instruction via the connection cable 158 to the RF generator 152. Upon receiving the initiate-power-supply instruction, the RF generator 152 generates the RF signal 170 having the frequency and power and supplies the RF signal 170 to the input 162 of the impedance matching circuit 154. An example of the RF signal 170 is a continuous wave signal.

The RF power supply 156 produces the RF signal 170 having a higher frequency than the low frequency of the RF power supply 110 (FIG. 1A). For example, the RF power supply 156 generates the RF signal 170 having a frequency of 60 MHz. To further illustrate, the RF signal 170 has the frequency of 60 MHz when the RF signal 170 oscillates at a frequency that ranges within a predetermined range from 60 MHz, such as between 58 MHz and 62 MHz. Also, as another example, the RF power supply 156 does not generate an RF signal having a frequency that is 400 kHz. As yet another example, the RF power supply 156 generates the RF signal 170 having a frequency of 27 MHz and the RF power supply 110 generates the RF signal 134 having a frequency of 400 kHz. As still another example, the RF power supply 156 generates the RF signal 170 having a frequency of 27 MHz and the RF power supply 110 generates the RF signal 134 having a frequency of 2 MHz.

Upon receiving the RF signal 170, the impedance matching circuit 154 matches an impedance of a load coupled to the output 164 of the impedance matching circuit 154 with an impedance of a source coupled to the input 162 of the impedance matching circuit 154 to output a modified RF signal 172. An example of the load coupled to the output 164 includes the chuck 106 and the RF transmission line 168. An example of the source includes the RF cable 126 and the RF generator 122.

The lower electrode of the chuck 106 receives the modified RF signal 172 via the RF transmission line 168 to be powered by the modified RF signal 172 to clean the residue within the edge ring pocket 130 and the gap 138. When the lower electrode of the chuck 106 is powered by the modified RF signal 172, plasma is stricken within the plasma chamber.

Moreover, the edge ring 102 is powered by the modified RF signal 134 to direct ions of the plasma towards edge ring pocket 130 as indicated by arrows pointing towards the edge ring pocket 130. For example, while the one or more process gases for cleaning the edge ring pocket 130 are supplied to the plasma chamber, the RF signal 132 is generated and the modified RF signal 134 is supplied to the edge ring 102 to maintain plasma within the plasma chamber. Both the modified RF signals 132 and 170 work in conjunction with each other to provide RF power to the edge ring 102 and the chuck 106 to remove or reduce the residue within the edge ring pocket 130 and the gap 138.

It should further be noted that a substrate is not being processed within the plasma chamber when the modified RF signal 134 is being supplied to the edge ring 102 and the modified RF signal 172 is being supplied to the lower electrode of the chuck 106. For example, during the time period in which the modified RF signal 134 is supplied to the edge ring 102 and the modified RF signal 172 is being supplied to the lower electrode of the chuck 106, there is no processing of the substrate within the plasma chamber.

In one embodiment, the RF power supply 156 does not generate an RF signal having a frequency that is 2 MHz or 13.56 MHz or 27 MHz.

In an embodiment, the RF signal 170 is supplied by the RF power supply 156 during a portion of the time period in which the RF signal 132 is supplied by the RF power supply 110. For example, the processor 114 provides the initiate-power-supply instruction to the RF generator 122 to generate the RF signal 132 before providing the initiate-power-supply instruction to the RF generator 152 to generate the RF signal 170. Also, the processor 114 provides an end-power-supply instruction to the RF generator 122 to stop generating the RF signal 132 after providing an end-power-supply instruction to the RF generator 152 to stop generating the RF signal 170.

In one embodiment, the RF signal 132 is supplied by the RF power supply 110 during a portion of the time period in which the RF signal 170 is supplied by the RF power supply 156. As an example, the processor 114 provides the initiate-power-supply instruction to the RF generator 122 to generate the RF signal 132 after providing the initiate-power-supply instruction to the RF generator 152 to generate the RF signal 170. Also, the processor 114 provides the end-power-supply instruction to the RF generator 122 to stop generating the RF signal 132 before providing the end-power-supply instruction to the RF generator 152 to stop generating the RF signal 170.

In an embodiment, both the RF signals 132 and 170 are supplied simultaneously for the same amount of time or substantially the same amount of time. As an example, the processor 114 provides the initiate-power-supply instruction to the RF generator 122 to generate the RF signal 132 at the same time or substantially the same time for providing the initiate-power-supply instruction to the RF generator 152 to generate the RF signal 170. To illustrate, the processor 114 provides the initiate-power-supply instruction to the RF generator 122 before or after a pre-determined time period from providing the initiate-power-supply instruction to the RF generator 152 to provide the initiate-power-supply instructions to the RF generators 122 and 152 at substantially the same time. Also, the processor 114 provides the end-power-supply instruction to the RF generator 122 to stop generating the RF signal 132 at the same time or substantially the same time for providing the end-power-supply instruction to the RF generator 152 to stop generating the RF signal 170. To illustrate, the processor 114 provides the end-power-supply instruction to the RF generator 122 before or after a pre-determined time period from providing the end-power-supply instruction to the RF generator 152 to provide the end-power-supply instructions to the RF generators 122 and 152 at substantially the same time.

In an embodiment, instead of the continuous wave RF signal 170, a pulsed RF signal is generated by the RF power supply 156. The pulsed RF signal generated by the RF power supply 156 has the multiple states, such as two or more states. State information, such as a logic level for each state, is provided by the processor 114 to the RF generator 152. In addition, frequency level and power level, for each state is provided by the processor 114 to the RF generator 152. The DSP of the RF generator 152 receives the state information, the power levels, and the frequency levels for the multiple states. The DSP of the RF generator 152 determines the first state from the multiple states based on the state information and provides the power level for the first state and the frequency level for the first state to the RF power supply 156 of the RF generator 152. Similarly, the DSP determines the second state from the multiple states based on the state information and provides the power level for the second state and the frequency level for the second state to the RF power supply 156 of the RF generator 152. The RF power supply 156 generates a pulsed RF signal having the multiple states and each state of the RF signal has the corresponding power level and the frequency level. For example, the pulsed RF signal generated by the RF power supply 156 transitions from the power level for the first state to the power level for the second state during a first transition time and transitions from the power level for the second state to the power level for the first state during a second transition time.

Figure 1C:
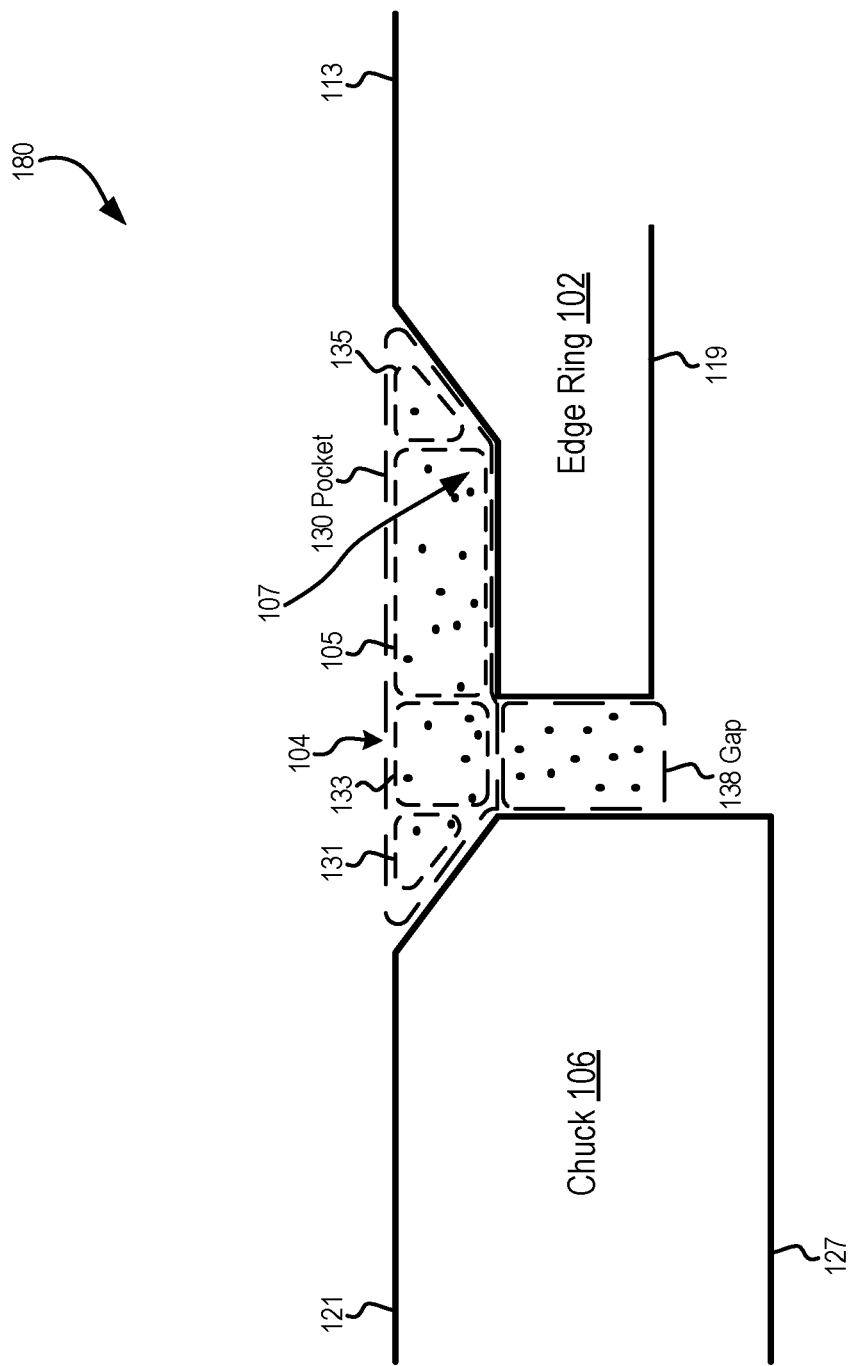
FIG. 1C is a diagram of an embodiment of a system to illustrate the edge ring pocket and the gap.
Figure 1D:
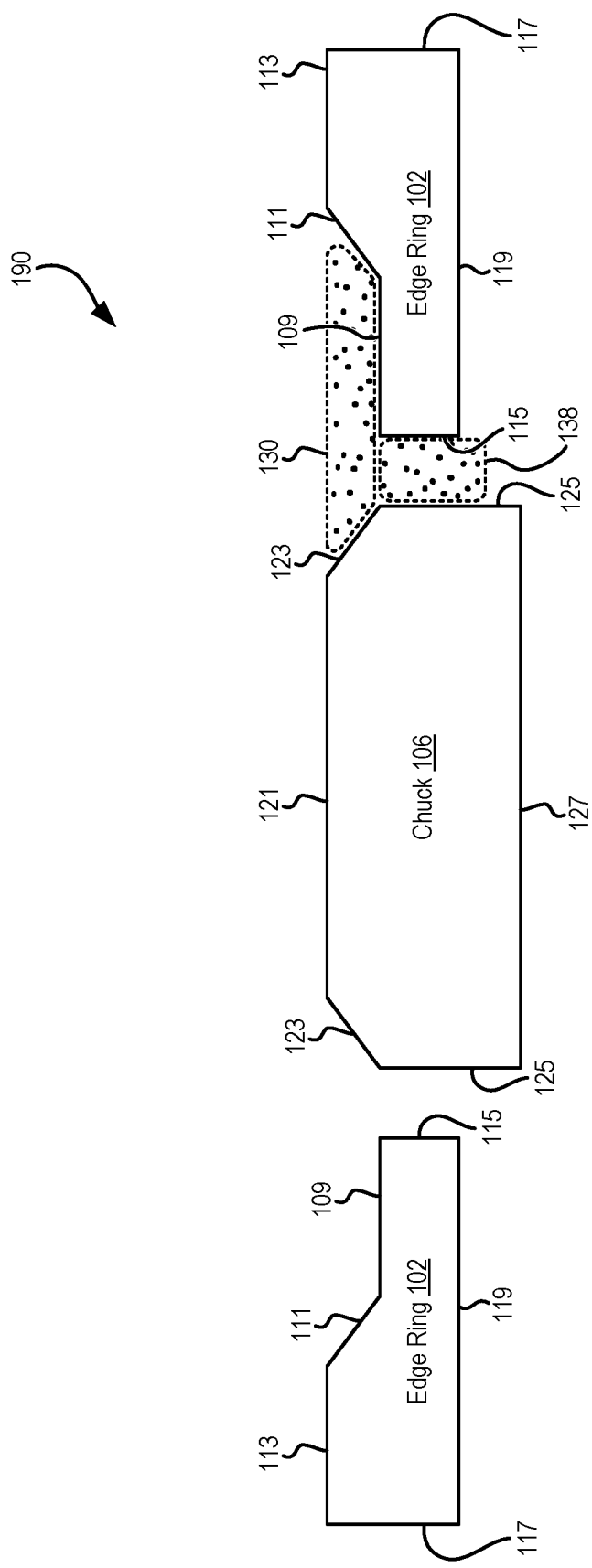
FIG. 1D is a diagram of an embodiment of a system to illustrate different portions of the chuck and the edge ring.

FIG. 1C is a diagram of an embodiment of a system 180 to illustrate the edge ring pocket 130 and the gap 138. Moreover, FIG. 1D is a diagram of an embodiment of a system 190 to illustrate different portions of the chuck 106 and the edge ring 102. Referring FIG. 1D, the chuck 106 has a top surface 121, an angled surface 123, a side surface 125, and a bottom surface 127. The angled surface 123 is adjacent to the top surface 121. As an example, the angled surface 123 is next to and forms an acute angle with respect to the top surface 121. The side surface 125 is adjacent to and at a level below the top surface 121. For example, the side surface 125 is next to and forms a right angle or an approximately 90° angle with respect to the top surface 120. An illustration of an approximately 90° angle is an angle between 85° and 95°. The bottom surface 127 is adjacent to the side surface 125. To illustrate, the bottom surface 127 is next to and forms a right angle or an approximately 90° angle with respect to the side surface 125.

Also, the edge ring 102 is adjacent to the chuck 106 and surrounds at least a portion of the chuck 106. For example, the edge ring 102 surrounds the angled surface 123 and a portion of the side surface 125 of the chuck 106. As another example, there are no rings, such as insulating rings or dielectric rings, between an inner side surface 115 of the edge ring 102 and the side surface 125 of the chuck 106. The edge ring 106 has an inner top surface portion 109, an angled top surface portion 111, and an outer top surface portion 113. The inner top surface portion 109, the angled top surface portion 111, and the outer top surface portion 113 together form a top surface 107 of the edge ring 102. The edge ring 102 also has the inner side surface 115, an outer side surface 117, and a bottom surface 119.

The angled top surface portion 111 is adjacent to the outer top surface portion 113. For example, the angled top surface portion 111 is next to and forms an acute angle with respect to the outer top surface portion 113. Also, the inner top surface portion 109 is adjacent to the angled top surface portion 111 and at a level below a level of the outer top surface portion 113. As an example, the angled top surface portion 111 is next to and forms an obtuse angle with respect to the inner top surface portion 109.

The inner side surface 115 is adjacent to the inner top surface portion 109. For example, the inner side surface 115 is next to and forms a right angle or an approximately 90° angle with respect to the inner top surface portion 109.

Moreover, the bottom surface 119 is adjacent to the inner side surface 115. For example, the bottom surface 119 is next to and forms a right angle or an approximately 90° angle with respect to the inner side surface 115. The outer side surface 117 is adjacent to both the outer top surface portion 113 and the bottom surface 119. As an example, the outer side surface 117 is next to and forms a right angle or an approximately 90° angle with respect to the outer top surface portion 113. Also, in the example, the outer side surface 117 is next to and forms a right angle or an approximately 90° angle with respect to the bottom surface 119.

Referring now to FIGS. 1C and 1D simultaneously, a region 131 or a portion of the edge ring pocket 130 is formed on top of and adjacent to the angled surface 123 of the chuck 106. Moreover, a region 133 or a portion of the edge ring pocket 130 is formed on top of and is adjacent to the gap 138, which is also a region. The region 133 is also located between a vertical plane that is parallel to and encompasses the side surface 125 of the chuck and a vertical plane that is parallel to and encompasses the inner side surface 115 of the edge ring 102. The gap 138 is formed between the side surfaces 125 and 115. For example, the gap 138 extends from the side surface 125 of the chuck 106 to the inner side surface 115 of the edge ring 102. The region 133 of the edge ring pocket 130 is on top of the gap 138.

A portion, such as regions 105 and 135, of the edge ring pocket 130, is defined by the inner top surface 109 and the angled top surface portion 111 of the edge ring 102. For example, the region 105 or a portion of the edge ring pocket 130 is formed on top of and adjacent to the inner top surface portion 109 of the edge ring 102. Also, the region 135 or a portion of the edge ring pocket 130 is formed on top of and adjacent to the angled top surface portion 111 of the edge ring 102. The region 133 is adjacent to the region 131 and the region 105 is adjacent to the region 133. Also, the region 135 is adjacent to the region 105. The region 133 is between the regions 131 and 105 and the region 105 is between the regions 133 and 135.

The edge ring pocket 130 extends from the top surface 121 of the chuck 106 to the outer top surface portion 113 of the edge ring 102. For example, the edge ring pocket 130 extends from an edge of the top surface 121 of the chuck 106 over the angled surface 123 of the chuck 106, the inner top surface portion 109 of the edge ring 102, and the angled top surface portion 111 of the edge ring 102 until the outer top surface portion 113 of the edge ring 112. The portion 133 of the edge ring pocket 130 extends over the gap 138.

In one embodiment, a first surface of a component, such as the edge ring 102 or the chuck 106, is adjacent to a second surface of the component when there is no third surface of the component between the first and second surfaces.

In an embodiment, a first region, e.g. the region 131, is adjacent to a second region, e.g., the region 133, when there is a lack of a third region between the first and second regions.

In one embodiment, the gap 138 extends between a horizontal level of the inner top surface portion 109 of the edge ring 102 and a horizontal level of the bottom surface 119 of the edge ring 102.

Figure 2A:
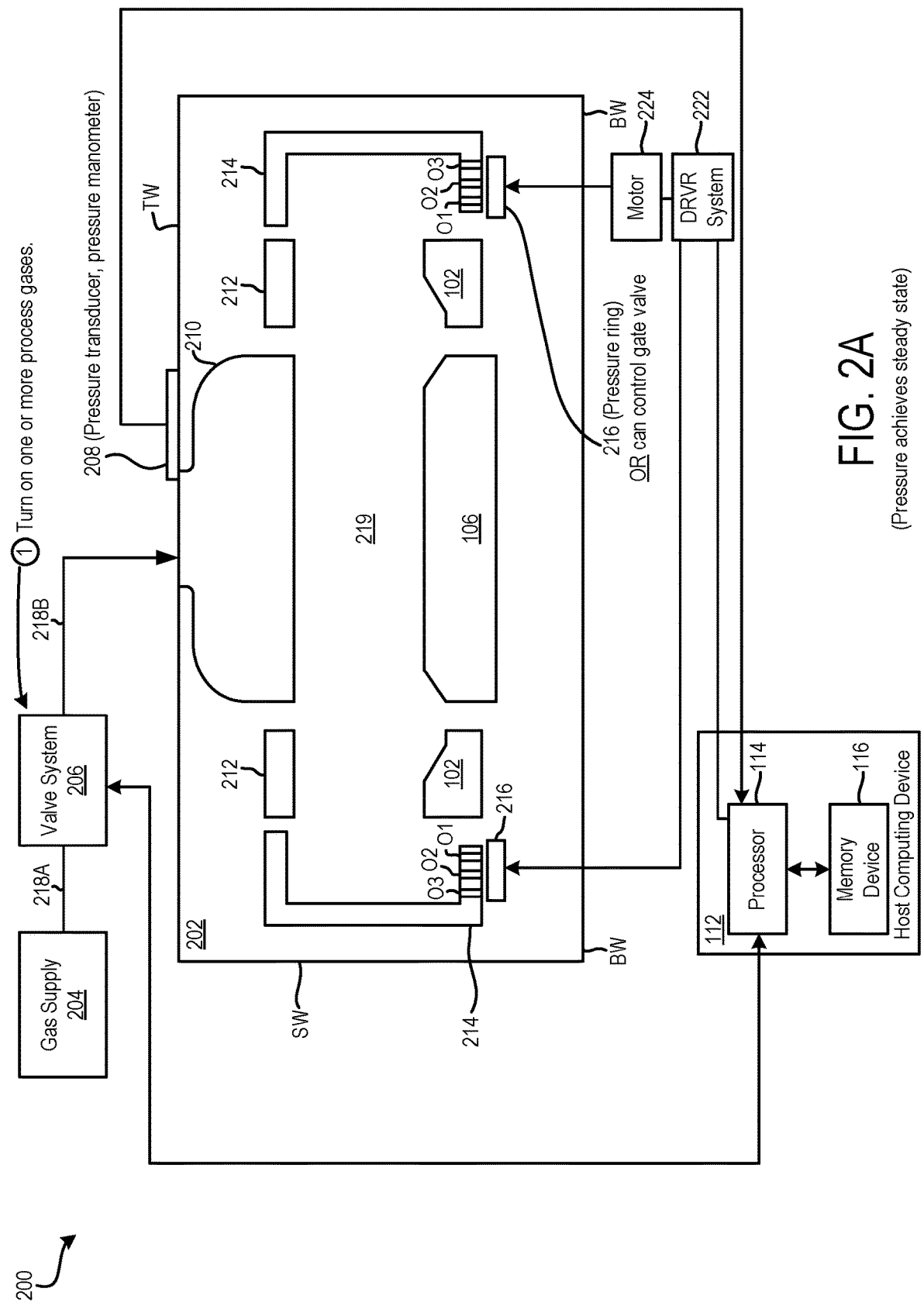
FIG. 2A is a diagram of an embodiment of the system to illustrate a sub-operation of achieving a steady state of pressure within a plasma chamber.

FIG. 2A is a diagram of an embodiment of the system 200 to illustrate a sub-operation of achieving a steady state of pressure at a desired pressure setpoint within a plasma chamber 202. The desired pressure setpoint is stored in the memory device 116 for access by the processor 114. The sub-operation of achieving the steady state is a first portion of a PER WAC operation. The system 200 includes a gas supply 204, a valve system 206, the plasma chamber 202, the host computing device 112, a pressure sensor 208, a driver system 222, and a motor 224.

An example of the gas supply 204 is a gas manifold or a gas source or a gas storage device or one or more gas containers that stores one or more process gases. Examples of the one or more process gases are provided below. Each container of the gas supply 204 stores a process gas or a mixture of two or more process gases. The valve system 206 includes one or more valves that allow or restrict passage of the one or more process gases from the gas supply 204 to the plasma chamber 202.

The plasma chamber 202 includes various components such as a showerhead 210, an upper edge electrode 212, a C-shroud 214, a pressure ring 216, the chuck 106, and the edge ring 102. The showerhead 210 includes an upper electrode and further includes one or more zones for supply of the one or more process gases to a gap 219. As an example, each zone is an opening that extends from or a set of openings that extend from a component, such as an upper electrode, of the showerhead 210 to the gap 210. Also, each zone is separated from an adjacent zone by a portion of the component of the showerhead 210. As another example, each zone is an opening that extends or a set of openings that extend to a space between the upper electrode of the showerhead 210 and a showerhead plate. As yet another example, some zones are located within the showerhead 210 to direct one or more process gases towards a central or inner region of the gap 219 and remaining zones are located within the showerhead 210 to direct one or more process towards a peripheral or outer region of the gap 219. The showerhead plate is an example another component of the showerhead 210 and is located above and adjacent to the gap 219. The upper electrode of the showerhead 210 is located above the space above the showerhead plate.

The outer region of the gap 219 surrounds or is disposed around the inner region of the gap 219. The gap 219 is surrounded by the C-shroud 214, the upper edge electrode 212, the showerhead 210, the edge ring 102, and the chuck 106.

The upper edge electrode 212 surrounds the showerhead 210, and an upper portion of the C-shroud 214 surrounds the upper edge electrode 212. The upper edge electrode 212 is made from metal, such as aluminum or an alloy of aluminum. The upper edge electrode 212 is peripheral to the showerhead 210 and the C-shroud 214 is peripheral to the upper edge electrode 212. Similarly, the edge ring 102 surrounds the portion of the chuck 106 and a lower portion of the C-shroud 214 surrounds the edge ring 102.

The edge ring 102 is adjacent to the chuck 106. For example, there is no other ring between the edge ring 102 and the chuck 106. As another example, there is the gap 138 (FIG. 1C) or space between the edge ring 102 and the chuck 106.

The C-shroud 214 includes multiple openings O1, O2, and O2 for controlling a pressure within the plasma chamber 202 and for facilitating an exit of plasma and/or the residue from the gap 219 to a region of the plasma chamber 202 below the gap 219 and further to one or more vacuum pumps. The one or more vacuum pumps are located adjacent to and below a bottom wall BW of the plasma chamber 202.

The pressure ring 216 is made from a metal, such as aluminum or an ally of aluminum. The pressure ring 216 is located adjacent to and below the openings O1 through O3 of the C-shroud 214. Examples of the pressure sensor 208 include a pressure transducer and a pressure manometer. The pressure sensor 208 is placed on or fixed to a top wall TW of the plasma chamber 220. A side wall SW of the plasma chamber 220 is located between the top wall TW and the bottom wall BW. The side wall SW may be of a polygonal shape, such as a square shape, or of a circular shape.

Examples of a driver system, described herein, include one or more transistors. To illustrate, the driver system 222 includes one or more transistors. Each transistor or a set of transistors of the driver system is sometimes referred to herein as a driver.

The processor 114 is coupled to the valve system 206. The gas supply 204 is coupled via a portion 218A of a gas line system to the valve system 206 and the valve system 206 is coupled via the remaining portion 218B of the gas line system to the showerhead 210. An example of a portion of the gas line system includes one or more gas lines, such as one or more gas pipes. The valve system 206 is coupled to the portions 218A and 218B of the gas line system to control a supply of the one or more process gases from the gas supply 204 to the showerhead 210 of the plasma chamber 202. The processor 114 is coupled to the pressure sensor 208 and is also coupled to the driver system 222. The driver system 222 is coupled to the motor 224 and the motor 224 is coupled to the pressure ring 216.

In the PER WAC operation, the process begins with the sub-operation of achieving the steady state of pressure at setpoint within the plasma chamber 202. Before the one or more process gases are supplied to the plasma chamber 202, the processor 114 controls movement of the pressure ring 216 so that the pressure ring 216 is located at a pre-set position. For example, the processor 114 controls the motor 224 via the driver system 222. When the motor 224 is controlled, the motor 224 operates to move the pressure ring 216 up or down in a vertical direction to change an amount of space or distance between the openings O1 through O3 and the pressure ring 216. In this manner, the processor 114 controls the movement of the pressure ring 216 to increase or decrease the amount of space between the pressure ring 216 and the openings O1 through O3 until the pressure ring 216 is at the pre-set position with respect to the openings O1 through O3. To illustrate, once the pressure ring 216 is at the pre-set position, there is no gap left or a minimal amount of gap is left between a top surface of the pressure ring 216 and the openings O1 through O3 of the C-shroud 214. The pre-set position of the pressure ring 216 is stored in the memory device 116 for access by the processor 114.

Moreover, in the PER WAC operation, once the pressure ring 216 is placed at the pre-set position, the gas supply 204 supplies the one or more process gases via the portion 218A of the gas line system, the valve system 206, and the portion 218B of the gas line system to the one or more zones of the showerhead 210. For example, the processor 114 sends a process gas supply signal to the valve system 206. Upon receiving the process gas supply signal, the one or more valves of the valve system 206 open or partially open.

When the one or more valves of the valve system 206 are open or partially open, the one or more process gases flow from the gas supply 204 via the portion 218B of the gas line system to the one or more zones of the showerhead 210. The one or more process gases flow via the one or more zones of the showerhead 210 to the gap 219 to increase pressure within the gap 219. After the one or more process gases are supplied to the gap 219, pressure within the plasma chamber 202 achieves the steady state at the desired pressure setpoint.

When the one or more process gases are supplied to the gap 219, the pressure sensor 208 measures pressure within the plasma chamber 202 and provides the measurements of the pressure to the processor 114. Also, upon supplying one or more process gases to the gap 219, or at some time thereafter, a pressure control system is activated. For example, the processor 114 controls the position of the pressure ring 216 to change pressure within the gap 219. The processor 114 continues to control the position of the pressure ring 216 until the pressure within the plasma chamber 202 has reached the desired pressure setpoint within some allowable range. To illustrate, in response to determining that the pressure within the plasma chamber 202 does not match the desired pressure setpoint, the processor 114 controls the motor 224 via the driver system 222. When the motor 224 is controlled, the motor 224 operates to move the pressure ring 216 up or down in a vertical direction to change an amount of space or distance between the openings O1 through O3 and the pressure ring 216. In this manner, the processor 114 controls the movement of the pressure ring 216 to increase or decrease the amount of space between the pressure ring 216 and the openings O1 through O3 until the pressure within the plasma chamber 202 reaches the desired pressure setpoint.

The processor 114 determines from the pressure versus time measurements associated with the plasma chamber 202 whether the pressure within the plasma chamber 202 has reached the steady state. For example, the processor 114 determines whether a first measurement of pressure is within a predetermined range from a second measurement of pressure. The first measurement is received from the pressure sensor 108 by the processor 114 before the second measurement is received from the pressure sensor 108 by the processor 114. The first and second measurements are obtained by the processor 114 from the pressure sensor 208 within a predetermined period of time, which is stored in the memory device 116. Upon determining that the first measurement is within the predetermined range from the second measurement, the processor 114 determines that the pressure within the plasma chamber 202 has reached the steady state. On the other hand, upon determining that the first measurement is not within the predetermined range from the second measurement, the processor 114 determines that the pressure within the plasma chamber 202 has not reached the steady state. At some time, based upon the pressure measurements, the processor 114 determines the pressure has reached the desired pressure setpoint and is at steady state. Based upon this, the processor 114 determines that the sub-operation of achieving the steady state of pressure at the desired pressure setpoint within the plasma chamber 202 is completed and the system 200 is ready to initiate a sub-operation of striking plasma, which is described below with reference to FIG. 2B.

In an embodiment, the C-shroud 214 has a different number of openings than three in the lower portion of the C-shroud 214. For example, the C-shroud 214 has four or five openings.

In one embodiment, the gas supply 204 includes a gas container in which multiple process gases are mixed together and the valve system 206 includes multiple valves. The mixture of the multiple process gases is supplied via the portion 218A of the gas line system, the valves of the valve system 206, and the portion 218B of the gas line system to the showerhead 210.

In one embodiment, in addition to controlling the pressure ring 216, one or more valves between the vacuum pumps and the plasma chamber 202 are controlled to achieve corresponding one or more pre-set positions stored in the memory device 116. For example, the processor 114 is coupled to a driver system, which is coupled to a motor system. The motor system is coupled to the one or more valves between the vacuum pumps and the plasma chamber 202. The processor 114 sends a close instruction to the driver system. Upon receiving the close instruction, the driver system outputs one or more current signals to the motor system. One or more motors of the motor system rotate to close the corresponding one or more valves between the vacuum pumps and the plasma chamber 202 to achieve the one or more pre-set positions.

In an embodiment, the showerhead 210 includes any number of zones, such as three, four, or five.

In one embodiment, instead of the three openings O1 through O3, any other number of openings, such as one, two, or four are located within a bottom portion of the C-shroud 214.

In an embodiment, one or more dielectric rings are placed between the showerhead 210 and the upper edge electrode 212. Similarly, in one embodiment, one or more dielectric rings are placed between the upper edge electrode 212 and the C-shroud 214.

Figure 2B:
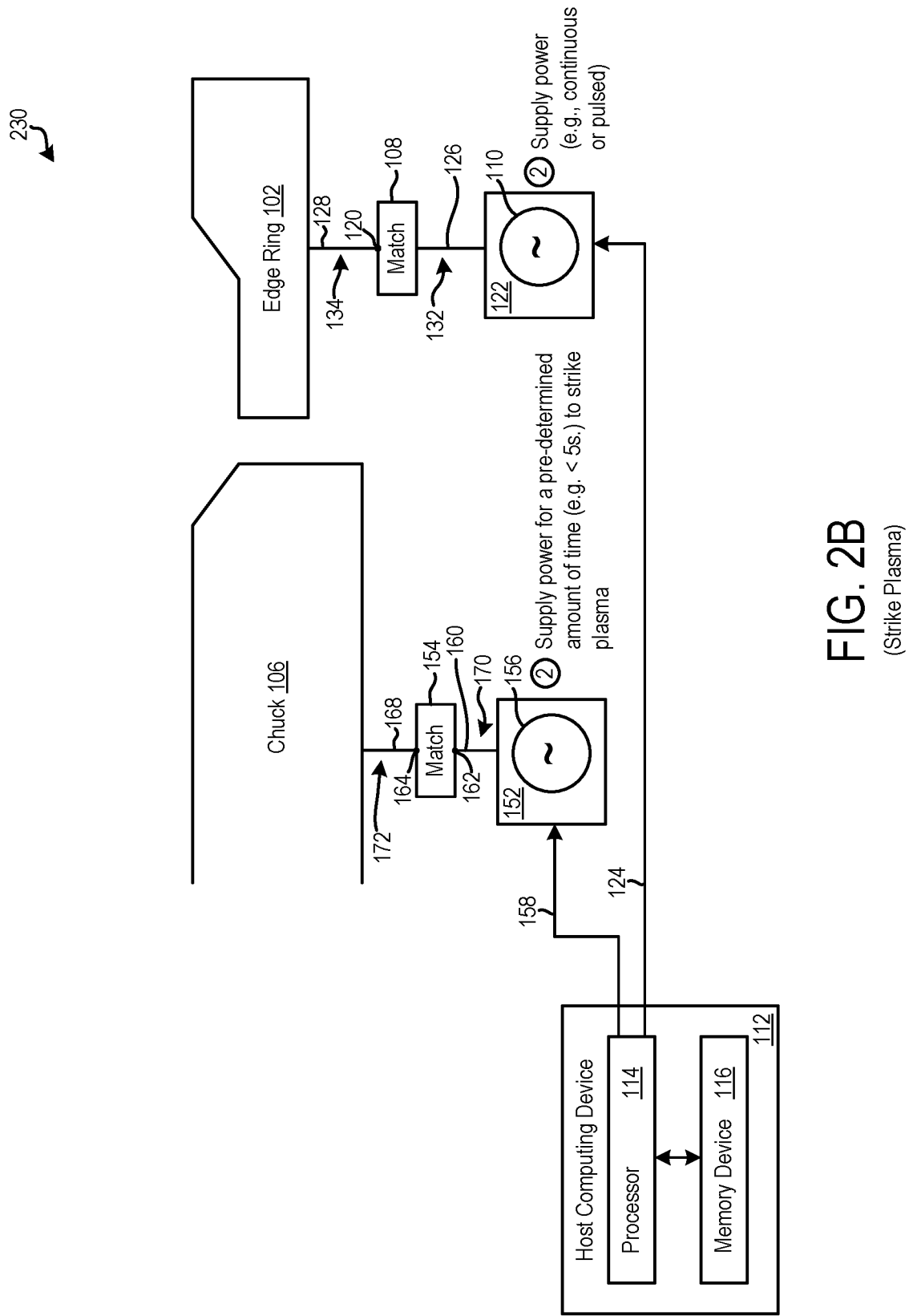
FIG. 2B is a diagram of an embodiment of a system to illustrate a sub-operation of striking plasma within a gap inside the plasma chamber.

FIG. 2B is a diagram of an embodiment of a system 230 to illustrate the sub-operation of striking plasma within the gap 219 (FIG. 2A) of the plasma chamber 202 (FIG. 2A). The sub-operation of striking plasma is a second portion of the PER WAC operation that is initiated above with reference to FIG. 2A. For example, the sub-operation of striking plasma is performed after performing the sub-operation of achieving the steady state of pressure at the desired pressure setpoint within the plasma chamber 202 (FIG. 2A). The system 230 includes the RF generators 122 and 152, the impedance matching circuits 108 and 154, the edge ring 102, and the chuck 106.

During the sub-operation of striking plasma within the plasma chamber 202, both the RF power supplies 110 and 156 supply the respective RF signals 132 and 170. To illustrate, the processor 114 provides the initiate-power-supply instruction to the RF generator 122 via the connection cable 124 and simultaneously sends the initiate-power-supply instruction to the RF generator 152 via the connection cable 158. Upon receiving the initiate-power-supply instruction via the connection cable 124, the RF power supply 110 of the RF generator 122 generates the RF signal 132. Similarly, upon receiving the initiate-power-supply instruction via the connection cable 158, the RF power supply 156 of the RF generator 152 generates the RF signal 170. As another illustration, the processor 114 sends the initiate-power-supply instruction to the RF generator 122 after a pre-determined period of time from sending the initiate-power-supply instruction to the RF generator 152. The pre-determined time period is stored in the memory device 116. In this example, the RF signal 132 is generated after the RF signal 170 is generated. As yet another illustration, the processor 114 sends the initiate-power-supply instruction to the RF generator 152 after a pre-set period of time from sending the initiate-power-supply instruction to the RF generator 122. In this example, the RF signal 170 is generated after the RF signal 132 is generated. The pre-set time period is stored in the memory device 116. When the RF signal 170 is generated, the modified RF signal 172 is supplied to the lower electrode of the chuck 106, and plasma is stricken within the plasma chamber 202 (FIG. 2A).

The modified RF signal 172 is supplied to the plasma chamber 202 while the one or more process gases, in the steady state, for cleaning the edge ring pocket 130 are being supplied to the gap 219 within the plasma chamber 202. The supply of the one or more process gases for cleaning the edge ring pocket 130 continues during the supply of the modified RF signal 172. For example, the modified RF signal 172 is supplied to the plasma chamber 202 simultaneous with the supply of the one or more process gases, in the steady state, to the gap 219 for striking plasma within the plasma chamber 202 to clean the edge ring pocket 130.

Similarly, the modified RF signal 134 is supplied to the plasma chamber 202 while the one or more process gases, in the steady state, for cleaning the edge ring pocket 130 are being supplied to the gap 219 within the plasma chamber 202. The supply of the one or more process gases for cleaning the edge ring pocket 130 continues during the supply of the modified RF signal 134. For example, the modified RF signal 134 is supplied to the plasma chamber 202 simultaneous with the supply of the one or more process gases, in the steady state, to the gap 219 for maintaining or sustaining plasma within the plasma chamber 202 to clean the edge ring pocket 130.

Figure 2C:
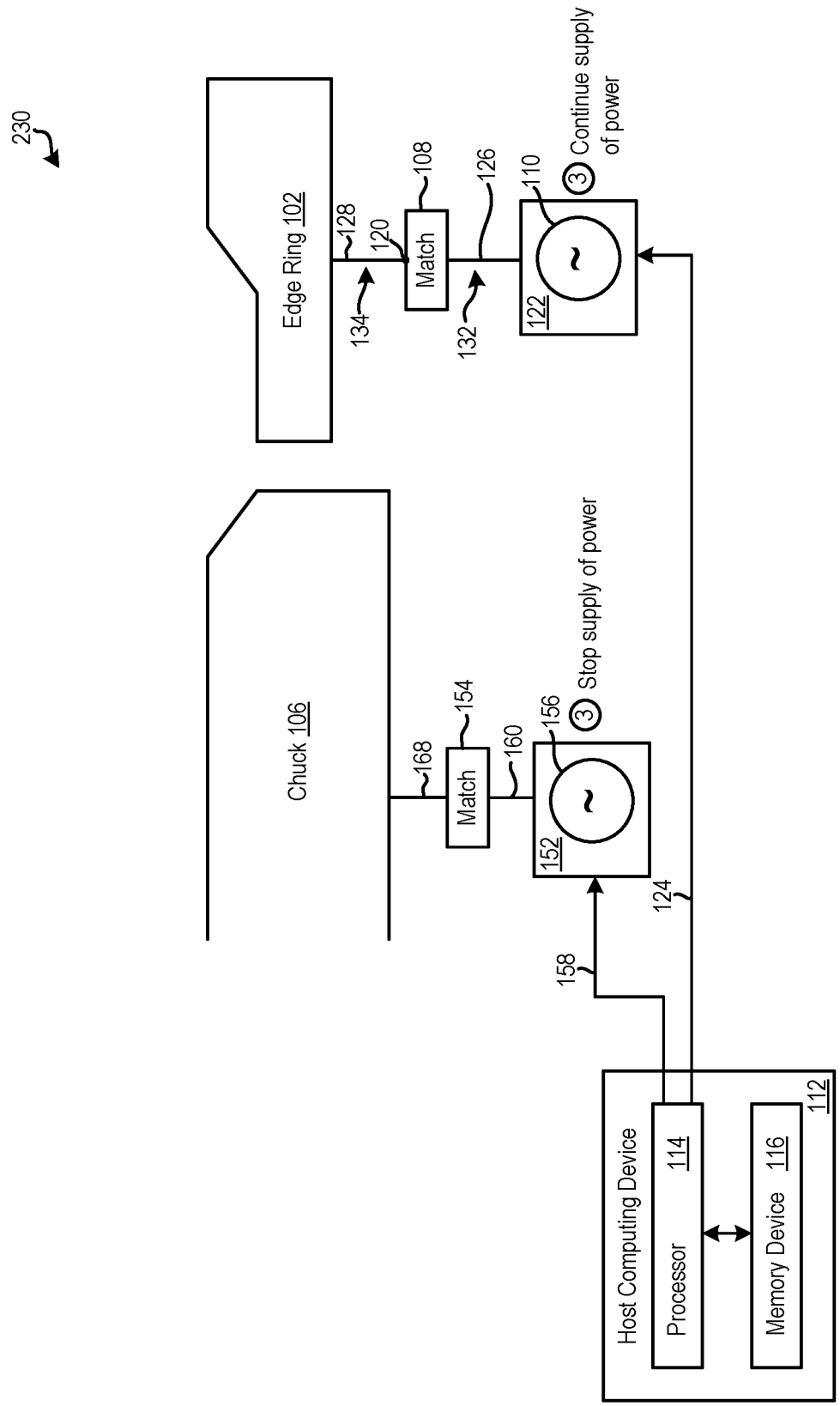
FIG. 2C is a diagram of an embodiment of a system to illustrate a sub-operation of discontinuing supply of an RF signal to the chuck and continuing the supply of an RF signal to the edge ring.

FIG. 2C is a diagram of an embodiment of the system 230 to illustrate a sub-operation of discontinuing supply of the RF signal 170 (FIG. 2B) and continuing the supply of the RF signal 132. The sub-operation of discontinuing supply of the RF signal 170 and continuing the supply of the RF signal 132 is a third portion of the PER WAC operation that is initiated above with reference to FIG. 2A. For example, the sub-operation of discontinuing supply of the RF signal 170 and continuing the supply of the RF signal 132 is performed after performing the sub-operation of striking plasma within the plasma chamber 202 (FIG. 2A). The sub-operation of striking plasma within the plasma chamber 202 is illustrated with reference to FIG. 2B.

Once a pre-determined amount of time has passed since supplying the RF signal 170, the RF generator 152 discontinues supplying the RF signal 170. For example, after the pre-determined amount of time has passed from a time at which the processor 114 provides the initiate-power-supply instruction, the processor 114 sends a stop-power-supply instruction to the RF generator 152. The pre-determined amount of time is stored in the memory device 116. An example of the pre-determined amount of time since supplying the RF signal 170 is a time period less than or equal to 5 seconds. To illustrate, the pre-determined amount of time ranges between 1 and 5 seconds. Upon receiving the stop-power-supply instruction from the processor 114, the RF power supply 156 of the RF generator 152 stops supplying the RF signal 170. For example, the RF power supply 156 ramps down the RF signal 170. To illustrate, an RF power level of the RF signal 170 decreases and is reduced to zero to ramp down the RF signal 170. Once the RF signal 170 is not generated by the RF power supply 156, the impedance matching circuit 154 does not output the modified RF signal 172 (FIG. 2B) to the chuck 106 and the chuck 106 does not receive any RF power.

The RF generator 122 continues to supply the RF signal 132 after the RF generator 152 stops supplying the RF signal 170. For example, the processor 114 does not provide a stop-power-supply instruction to the RF generator 122 after the pre-determined amount of time since the RF signal 170 is supplied by the RF generator 152. The RF generator 122 continues to supply the RF signal 132 to maintain plasma that is stricken by the supply of the modified RF signal 172 to the lower electrode of the chuck 106.

Figure 2D:
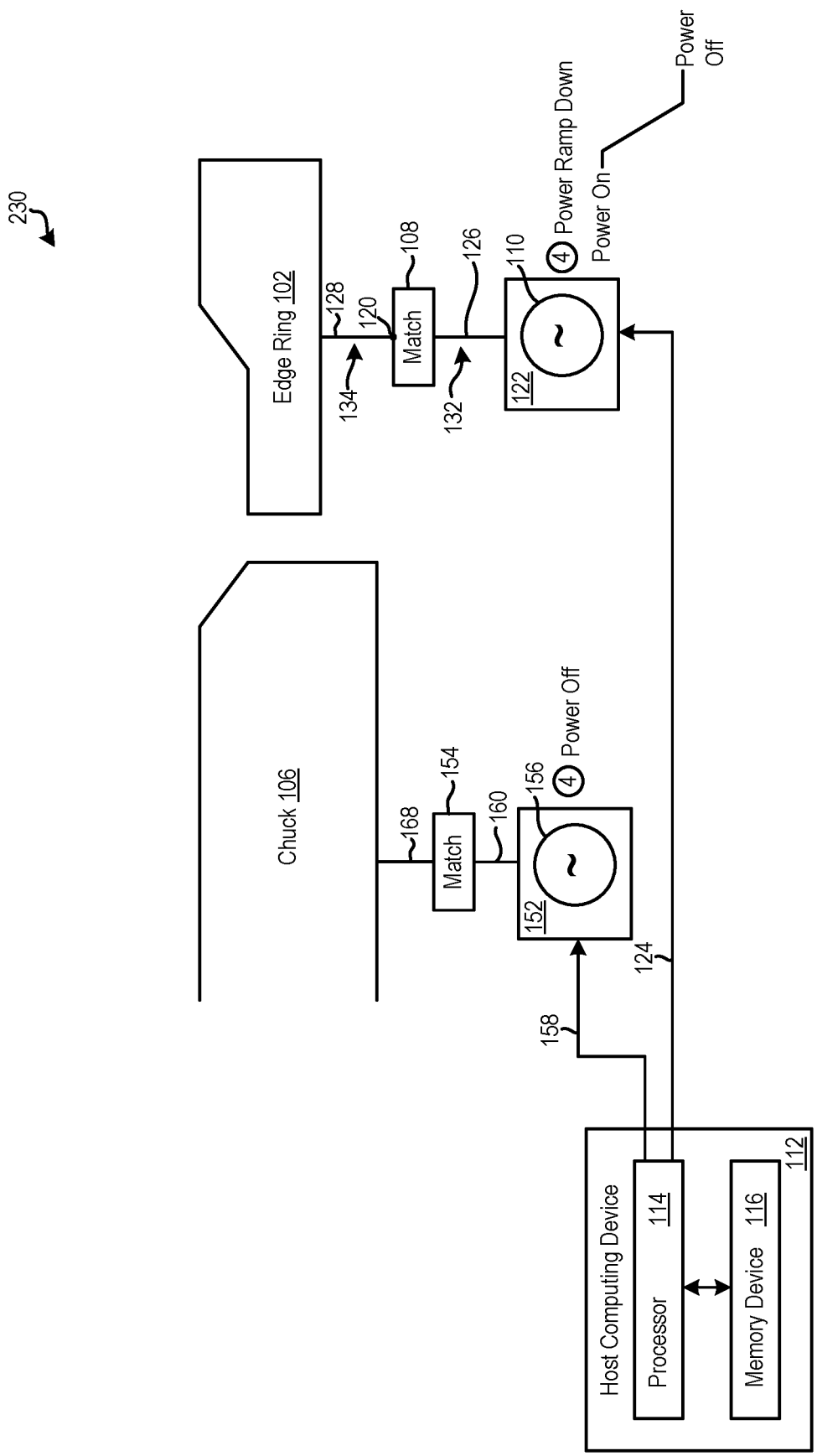
FIG. 2D is a diagram of an embodiment of a system to illustrate a power ramp down sub-operation for an RF generator that supplies power to the edge ring.

FIG. 2D is a diagram of an embodiment of the system 230 to illustrate a power ramp down sub-operation for the RF generator 122. The power ramp down sub-operation for the RF generator 122 is a fourth portion of the PER WAC operation that is initiated above with reference to FIG. 2A. For example, the power ramp down sub-operation of the RF generator 122 is performed after performing the third sub-operation of discontinuing supply of the RF signal 170 (FIG. 2B) and continuing the supply of the RF signal 132 (FIG. 2C). The third sub-operation is described above with reference to FIG. 2C.

During the power ramp down sub-operation of the RF generator 122, the processor 114 generates and supplies a power-ramp-down instruction to the RF generator 122. Upon receiving the power-ramp-down instruction, the RF generator 122 ramps down, such as reduces and eventually stops, supplying the RF signal 132. Moreover, during the power ramp down sub-operation of the RF generator 122, the RF generator 152 does not supply the RF signal 170 (FIG. 2B). Once the RF signal 132 is not generated by the RF power supply 110, the impedance matching circuit 108 does not output the modified RF signal 134 to the edge ring 102 and the edge ring 102 does not receive any RF power.

FIG. 2E is a diagram of an embodiment of a system 240 to illustrate a sub-operation of turning off the supply of the one or more process gases for cleaning the edge ring pocket 130 and the gap 138. The one or more process gases for cleaning the edge ring pocket 130 and the gap 138 continue be supplied to maintain the steady state within the plasma chamber 202 during the sub-operations described above with reference to FIG. 2B through 2D. The sub-operation of turning off the supply of the one or more process gases is a fifth portion of the PER WAC operation that is initiated above with reference to FIG. 2A. For example, the sub-operation of turning off the supply of the one or more process gases to the plasma chamber 202 is performed after performing the power ramp down sub-operation of the RF signal 132, described above with reference to FIG. 2D.

During the sub-operation of turning off the supply of the one or more process gases to the plasma chamber 202, the valve system 206 shuts off the supply of the one or more process gases from the gas supply 204 via the portion 218B of the gas line system to the showerhead 210. For example, the processor 114 sends a gas cut-off signal to the valve system 206. Upon receiving the gas cut-off signal, the valves of the valve system 206 close. When the valves of the valve system 206 close, the one or more process gases do not pass via the valve system 206 to the shower head 210. The PER WAC operation that is described as being initiated with reference to FIG. 2A ends after the sub-operation of stopping the supply of the one or more process gases.

In one embodiment, one or more inert gases are supplied from the gas supply 204 after the supply of the one or more process gases to the showerhead 210 is turned off during the sub-operation described above with reference to FIG. 2E. Examples of an inert gas include argon and nitrogen. The inert gases are supplied in the same manner to the showerhead 210 in which the one or more process gases are supplied to the showerhead 210. For example, the processor 114 sends an inert gas supply signal to the valve system 206. Upon receiving the inert gas supply signal, the one or more valves of the valve system 206 open or partially open.

When the one or more valves of the valve system 206 open or partially open, the one or more inert gases flow from the gas supply 204 via the portion 218A of the gas line system, the valve system 206, the portion 218B of the gas line system, and the one or more zones of the showerhead 210 to the gap 219. The PER WAC operation that is described as being initiated with reference to FIG. 2A ends after the sub-operation of supplying the one or more inert gases.

Figure 3A:
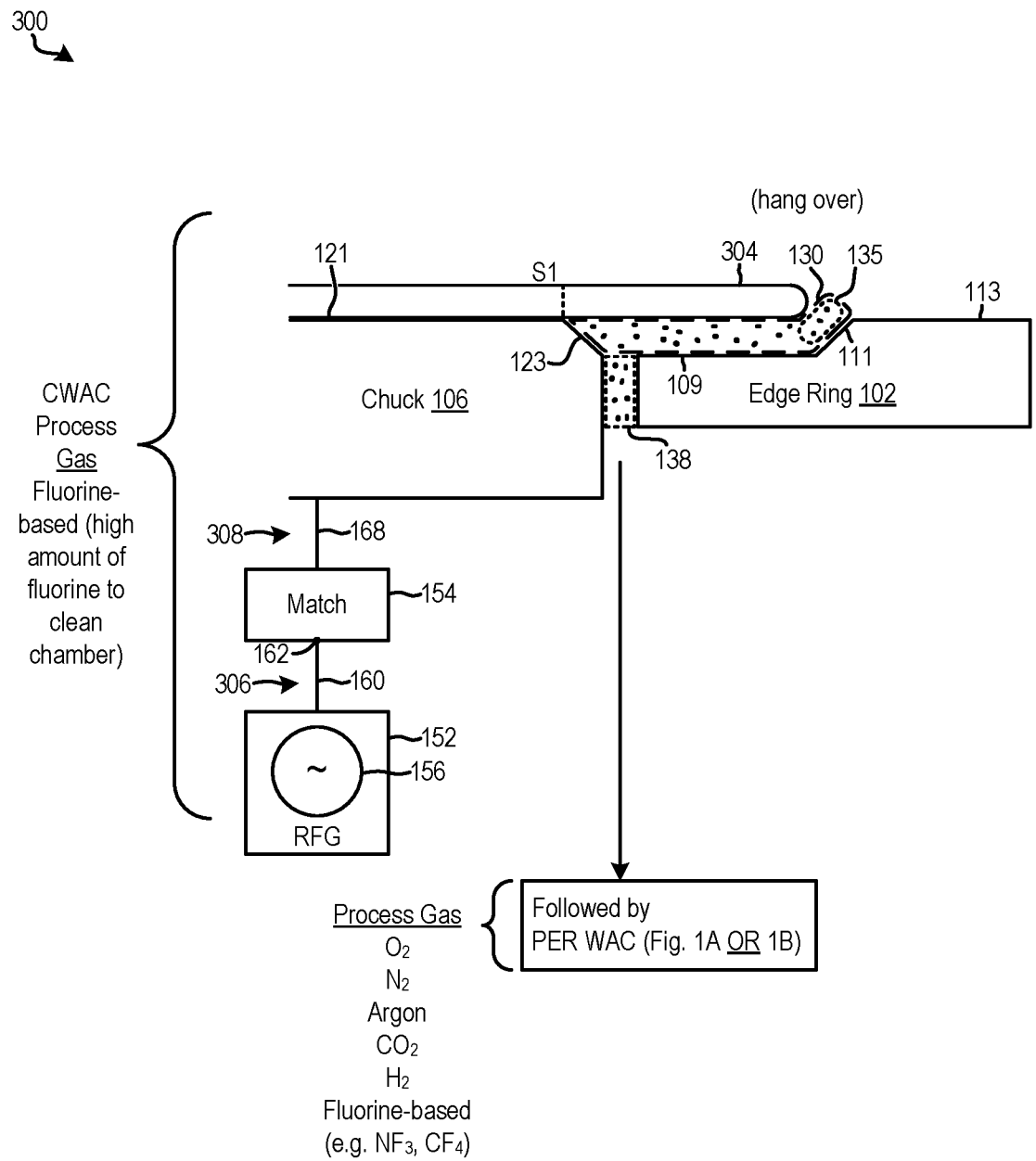
FIG. 3A is a diagram of an embodiment of a system to illustrate a covered wafer auto clean (CWAC) operation that is performed before a powered edge ring wafer auto clean (PER WAC) operation, described above, with reference to FIG. 1A, or 1B, or 2A-2E.

FIG. 3A is a diagram of an embodiment of a system 300 to illustrate a covered wafer auto clean (CWAC) operation that is performed before the PER WAC operation, described above, with reference to FIG. 1A, or 1B, or 2A-2E. The system 300 includes the edge ring 102, the chuck 106, the RF generator 152, and the match 154.

During the CWAC operation, a substrate S1 is placed on the top surface 121 of the chuck 106. An example of the substrate S1 is a dummy substrate, which is not to be processed, such as etched or deposited on or sputtered or cleaned. The dummy substrate may be fabricated from one or more semiconductors, such as silicon. The substrate S1 is placed on top of the chuck 106 to have an overhang portion 304 that hangs or extends over a portion of the chuck 106, the gap 138, and a portion of the edge ring 102. For example, the overhang portion 304 extends over the angled surface 123 of the chuck 106, the gap 138, and the inner top surface portion 109 of the edge ring 102. The overhang portion 304 extends from the top surface 121 of the chuck 106 until the angled top surface portion 111 of the edge ring 102.

During the CWAC operation, the processor 114 (FIG. 1A) controls the valve system 206 (FIG. 2A) to supply one or more process gases that are different from the one or more process gases supplied during the PER WAC operation, described above with reference to FIG. 1A or FIG. 1B or FIGS. 2A-2E. For example, during the CWAC operation, a cleaning agent within the one or more process gases is greater than an amount of a cleaning agent within the one or more process gases supplied during the PER WAC operation. To illustrate, during the CWAC operation, the one or more process gases supplied include a fluorine-based gas, which has a higher amount of fluorine compared to an amount of fluorine within the one or more process gases supplied during the PER WAC operation. Fluorine is an example of the cleaning agent. The one or more process gases are supplied during the CWAC operation in the same manner in which the one or more process gases are supplied during the PER WAC operation.

Furthermore, during the CWAC operation, the RF power supply 156 generates an RF signal 306 and a modified RF signal 308 is output from the impedance matching circuit 154 to the lower electrode of the chuck 106 to generate plasma within the plasma chamber 202 (FIG. 2A). For example, the processor 114 (FIG. 1A) generates an initiate-power-supply instruction having values of the parameters, such as frequency and power, and provides the initiate-power-supply instruction via the connection cable 158 (FIG. 1B) to the RF generator 152. Upon receiving the initiate-power-supply instruction, the RF generator 152 generates the RF signal 306 having the frequency and power and supplies the RF signal 306 to the input 162 of the impedance matching circuit 154. An example of the RF signal 306 is a continuous wave signal. The impedance matching circuit 154 matches an impedance of the load coupled to the output 164 of the impedance matching circuit 154 with an impedance of the source coupled to the input 162 of the impedance matching circuit 154 to output a modified RF signal 308. The lower electrode of the chuck 106 receives the modified RF signal 308 via the RF transmission line 168 to be powered by the modified RF signal 308 to strike plasma within the plasma chamber 202 (FIG. 2A). The plasma generated during the CWAC operation cleans, such as reduces or minimally reduces, the residue within the region 135. Also, the plasma generated during the CWAC operation cleans inner surfaces of the side wall SW (FIG. 2A), the top wall TW (FIG. 2A), and the bottom wall BW (FIG. 2A) of the plasma chamber 202 and components, such as the showerhead 210 (FIG. 2A), the upper edge electrode 212 (FIG. 2A), and the C-shroud 214 (FIG. 2A), of the plasma chamber 202.

Moreover, during the CWAC operation, there is no supply of RF power to the edge ring 102. For example, during the CWAC operation, the processor 114 (FIG. 1A) does not generate and send the initiate-power-supply instruction to the RF generator 122 (FIG. 1A) that is coupled via the impedance matching circuit 108 (FIG. 1A) to the edge ring 102. As such, during the CWAC operation, the modified RF signal 134 (FIG. 1A) is not output from the impedance matching circuit 108 to the edge ring 102.

It should be noted that during the CWAC operation, at least some portion of the residue within the edge ring pocket 130 and the gap 138 is not removed. For example, during the CWAC operation, most of the residue within the edge ring pocket 130 and the gap 138 is usually not removed by the CWAC operation. As another example, after the CWAC operation, a substantial amount of the residue remains within the edge ring pocket 130 and the gap 138. The overhang portion 304 protects the residue from being removed by the plasma that is generated during the CWAC operation. The plasma generated during the CWAC operation cleans, such reduces, the residue within the region 135 that does not lie under the overhang portion 304 of the substrate S1.

During an end portion of the CWAC operation, the processor 114 controls the valve system 206 (FIG. 2A) to turn off the one or more process gases supplied during the CWAC operation and controls the RF generator 152 to stop generating the RF signal 306. For example, the processor 114 controls the valve system 206 in the manner described above to turn off the supply of the one or more process gases of the CWAC operation to the plasma chamber 202. The processor 114 closes the valves of the valve system 206 to shut off the supply of the one or more process gases of the CWAC operation from the gas supply 204 via the portion 218B of the gas line system to the showerhead 210. Also, the processor 114 generates and supplies a power-stop instruction to the RF generator 152. Upon receiving the power-stop instruction, the RF generator 152 ramps down, such as reduces and eventually stops, supplying the RF signal 306. Once the RF signal 306 is not generated by the RF power supply 156, the impedance matching circuit 154 does not output the modified RF signal 308 to the lower electrode of the chuck 106 and the chuck 106 does not receive any RF power.

Once the CWAC operation ends, the processor 114 controls the valve system 206 and one or both the RF generators 122 and 152 to perform the PER WAC operation. For example, the processor 114 controls the valve system 206 and the RF generator 122 to perform the PER WAC operation described above with reference to FIG. 1A or 1B or FIGS. 2A-2E after performing the CWAC operation. During the PER WAC operation described above with reference to FIG. 1A or 1B or FIGS. 2A-2E, the one or more process gases for the PER WAC operation are supplied from the gas supply 204 via the portion 218A of the gas line system, the valve system 206 (FIG. 2A), and the portion 218B of the gas line system to the plasma chamber 202 (FIG. 2A). Examples of the one or more process gases for the PER WAC operation include oxygen, nitrogen, argon, carbon dioxide, hydrogen, and the fluorine-based gas, and a combination of two or more thereof. To illustrate, the fluorine-based gas is of an amount that is ranges from 0.5% and 15% of the two or more of the process gases used to clean the edge ring pocket 130. To further illustrate, the fluorine-based gas is 0.5% of a total amount of a mixture of the fluorine-based gas and hydrogen. As another illustration, the fluorine-based gas is 12% of a total amount of a mixture of the fluorine-based gas, oxygen, and carbon dioxide. An example of the fluorine-based gas used during the PER WAC operation includes a gas that includes a smaller amount of fluorine compared to an amount of fluorine within the one or more process gases used to perform the CWAC operation. The smaller amount of fluorine during the PER WAC operation does not damage the chuck 106 or damages the chuck 106 minimally compared to the amount of fluorine of the one or more process gases supplied during the CWAC operation. The one or more process gases are supplied during the PER WAC operation in the same manner as that described above with reference to FIG. 2A. Also, sometimes, the residue within the edge ring pocket 130 and the gap 138 is silicon. It is difficult to reduce or remove silicon using oxygen as a process gas during the PER WAC operation compared to using the fluorine-based gas during the PER WAC operation. Other examples of the fluorine-based gas include nitrogen trifluoride ($NF_3$) and Tetrafluoromethane ($CF_4$).

In one embodiment, the overhang portion 304 extends from the top surface 121 until any point between the top surface 121 of the chuck 106 and the outer top surface portion 113 of the edge ring 102. For example, the overhang portion 304 extends over the angled surface 123 of the chuck 106, the gap 138, and a portion of the inner top surface portion 109 of the edge ring 102.

Figure 3B:
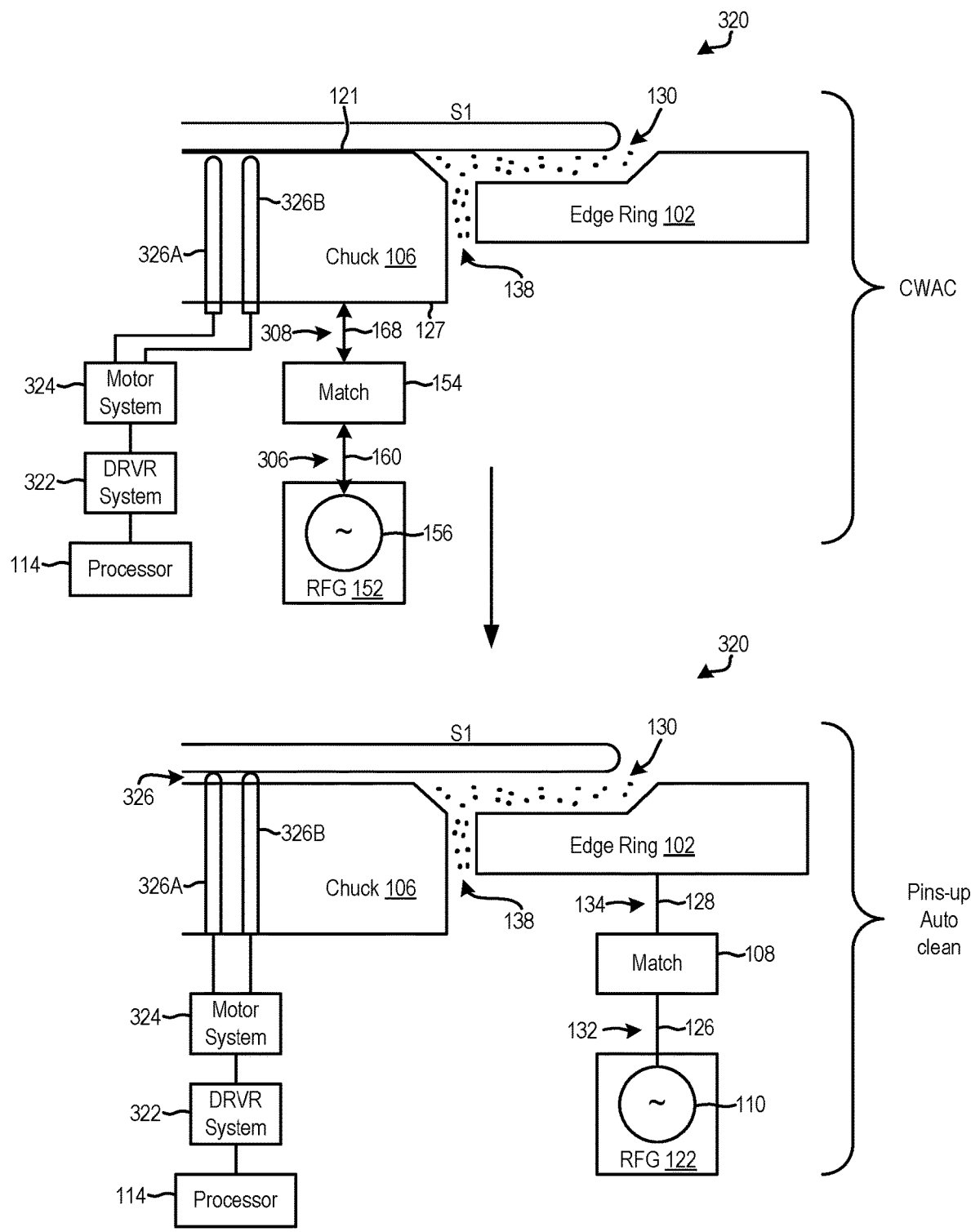
FIG. 3B is a diagram of an embodiment of a system to illustrate performance of the CWAC operation followed by a pins-up auto clean operation.

FIG. 3B is a diagram of an embodiment of a system 320 to illustrate performance of the CWAC operation followed by a pins-up auto clean operation. For example, the pins-up auto clean operation is executed next to the CWAC operation. The system 320 includes the chuck 106, the edge ring 102, the RF generator 152, the impedance matching circuit 154, the processor 114, a driver system 322, and a motor system 324.

An example of the motor system 324 includes one or more electric motors. An example of the driver system 322 includes one or more drivers, examples of which are provided above.

The processor 114 is coupled to the driver system 322, which is coupled to the motor system 324. Each motor of the motor system 324 is coupled via one or more connection mechanisms to a respective one of lift pins 326A and 326B. Examples of a connection mechanism includes one or more shafts and a combination of one or more shafts and one or more gears. The shafts are coupled with each other via the one or more gears. Each lift pin 326A and 326B extends via through or via a body of the chuck 106. For example, each lift pin 326A and 326B extends from the bottom surface 127 of the chuck 106 to the top surface 121 of the chuck 106. Each lift pin 326A and 326B is fabricated from a metal, such as aluminum or alloy of aluminum.

The CWAC operation is performed in the same manner as the CWAC operation described above with reference to FIG. 3A to provide the modified RF signal 308 to the lower electrode of the chuck 106 via the RF transmission line 168. Moreover, during the CWAC operation described with reference to FIG. 3B, the processor 114 does not send a lift-instruction to the driver system 322. The driver system 322 does not generate one or more current signals when the lift-instruction is not received. The motors of the motor system 324 do not rotate when the one or more current signals are not received from the driver system 322. Also, when the motors of the motor system 324 do not rotate, the lift pins 326A and 326B are not lifted up in the vertical direction to extend above the top surface 121 of the chuck 106 to lift the dummy substrate S1 above the top surface 121. The dummy substrate S1, when not lifted, rests on the top surface 121 of the chuck 106.

After the CWAC operation ends, the pins-up auto clean operation is performed. The pins-up auto clean operation includes the PER WAC operation that is described above with respect to FIG. 1A. During the pins-up auto clean operation, before the one or more process gases for performing the PER WAC operation are supplied to the plasma chamber 202 (FIG. 2A), the substrate S1 is lifted to be above the top surface 121 of the chuck 106. For example, during the pins-up auto clean operation, the processor 114 generates and sends the lift-instruction to the driver system 322. The driver system 322 generates the one or more current signals when the lift-instruction is received. The motors of the motor system 324 rotate when the one or more current signals are received from the driver system 322. Also, when the motors of the motor system 324 rotate, the lift pins 326A and 326B are lifted up in the vertical direction to extend to a level above the top surface 121 of the chuck 106 to lift the dummy substrate S1 above the top surface 121. The dummy substrate S1, when lifted, does not rest on the top surface 121 of the chuck 106 but is above the top surface 121. For example, there is a gap 326 or space between the dummy substrate S1 and the top surface 121 when the dummy substrate S1 is lifted above the top surface 121.

There is no need to remove the substrate S1 from the plasma chamber 202 (FIG. 2A) between the CWAC operation and the pins-up auto clean operation. Rather, the substrate S1 is lifted above the top surface 121 of the chuck 106 after the CWAC operation and before the pins-up auto clean operation. The substrate S1 remains lifted during the PER WAC operation to perform the pins-up auto clean operation. Both the CWAC and pins-up operations can be performed with the substrate S1 inside the plasma chamber 202. For example, after the CWAC operation is used to pre-coat the plasma chamber 202 for preparing the plasma chamber 202 for processing a substrate within the plasma chamber 202, the residue from the edge ring pocket 130 and the gap 138 is cleaned using the PER WAC operation without removing the dummy substrate S1. During the pre-coat operation, the walls SW, BW, and TW of the plasma chamber 202 are coated with remnants of the plasma that is generated during the CWAC operation.

Moreover, the chuck 106 is worn less during the pins-up auto clean operation compared to an amount of wear of the chuck 106 that occurs during the PER WAC operation without the substrate S1 placed on the top surface 121 of the chuck 106. The substrate S1 protects the chuck 106 from plasma that is generated on top of the chuck 106 during the pins-up auto clean operation.

Figure 3C:
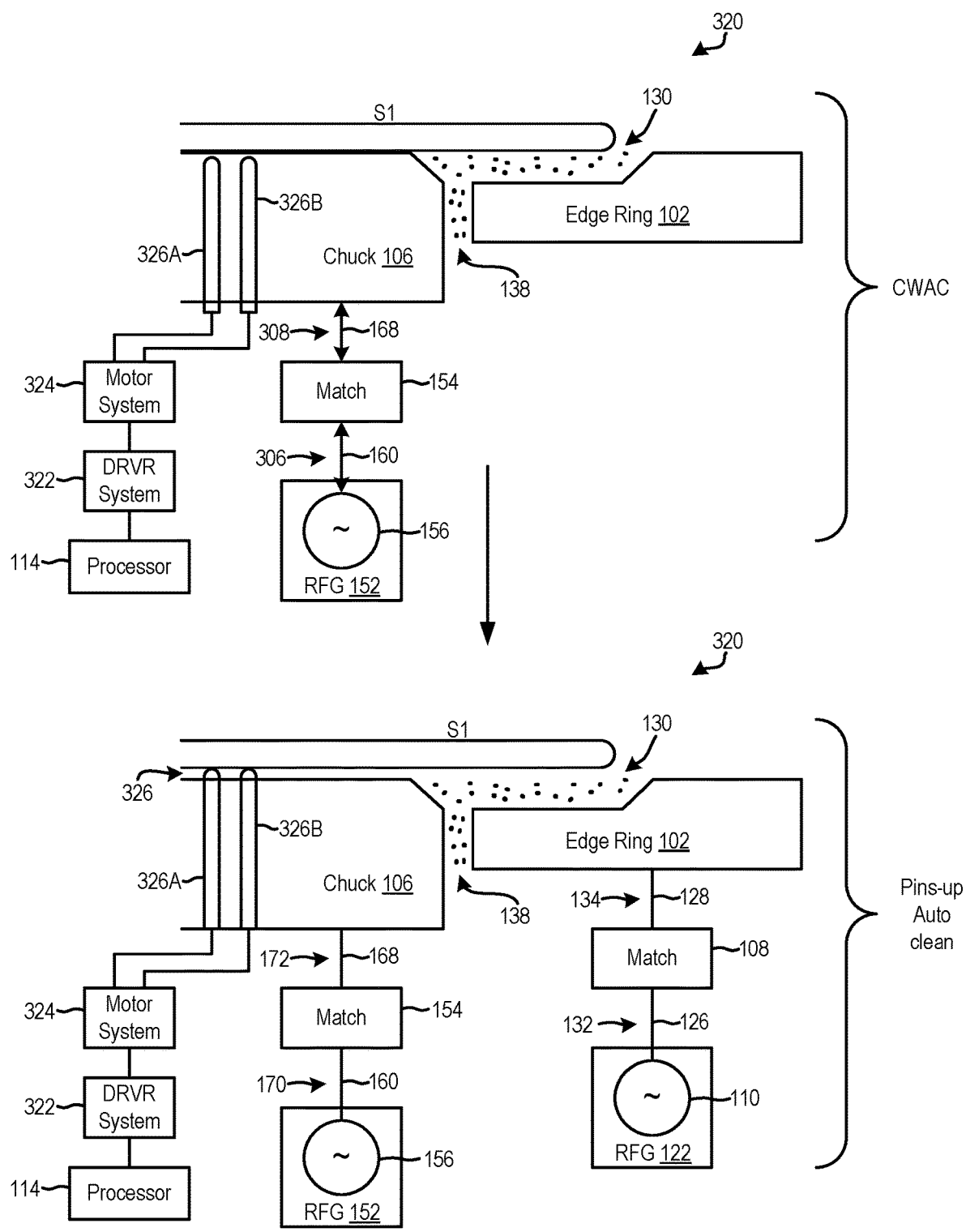
FIG. 3C is a diagram of an embodiment of a system to illustrate a pins-up auto clean operation that follows the CWAC operation, which is described above with reference to FIG. 3B.

FIG. 3C is a diagram of an embodiment of the system 320 to illustrate a pins-up auto clean operation that follows the CWAC operation, which is described above with reference to FIG. 3B. For example, the pins-up auto clean operation is performed next to the CWAC operation. The pins-up auto clean operation includes the PER WAC operation that is described above with reference to FIG. 1B or with reference to FIGS. 2A-2E. For example, during the PER WAC operation described above with reference to FIG. 1B or with reference to FIGS. 2A-2E, the RF signal 170 is generated in addition to the RF signal 132. The modified RF signal 172 that is output based on the RF signal 170 is supplied to the chuck 106 via the RF transmission line 168 and the modified RF signal 134 that is generated based on the RF signal 132 is supplied to the edge ring 102 via the RF connector 128. Moreover, during the pins-up auto clean operation, before the one or more process gases for performing the PER WAC operation are supplied to the plasma chamber 202 (FIG. 2A), the substrate S1 is lifted to be above the top surface 121 of the chuck 106 to form the gap 326 between a bottom surface of the substrate S1 and the top surface 121 of the chuck 106. The substrate S1 remains lifted during the PER WAC operation to perform the pins-up auto clean operation.

Figure 4:
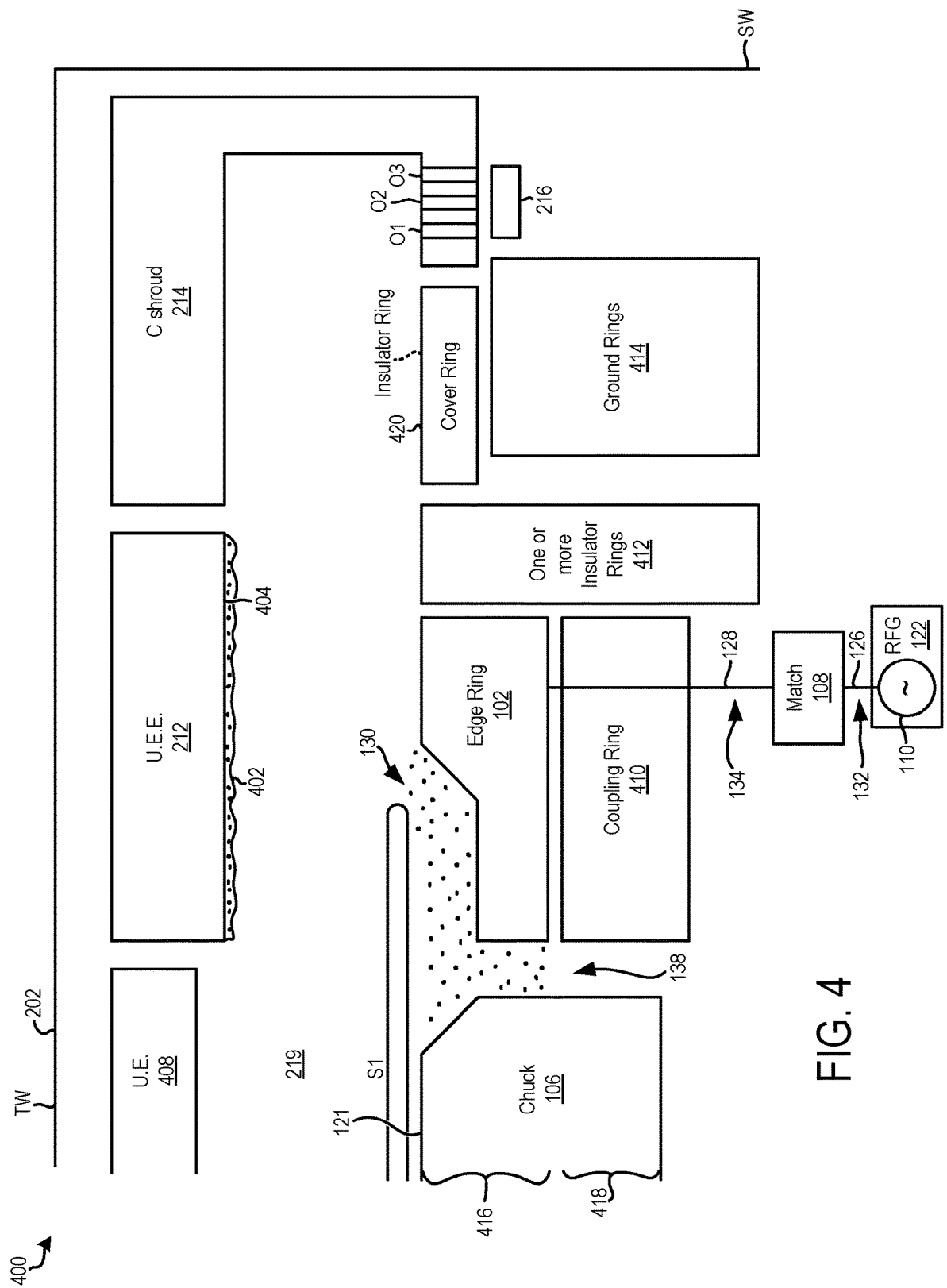
FIG. 4 is a diagram of an embodiment of a system to illustrate that residue that is deposited on a bottom surface of an upper electrode extension is removed or reduced during the PER WAC operation of FIG. 1A, or 1B, or 2A-2E.

FIG. 4 is a diagram of an embodiment of a system 400 to illustrate that residue 402 that is deposited under a bottom surface 404 of the upper electrode extension 212 is removed during the PER WAC operation. The plasma chamber 202 of the system 400 includes an upper electrode 408 of the showerhead 210 (FIG. 2A). The plasma chamber 202 further includes the upper electrode extension 212 that is disposed around or surrounds a portion, such as an upper electrode 408, of the showerhead 210. The upper electrode 408 is made from a silicon or silicon carbide. The system 400 includes the C-shroud 214 that is disposed around or surrounds the upper electrode extension 212.

The plasma chamber 202 includes the chuck 106. The top surface 121 of the chuck 106 is located across the gap 219 from the showerhead 210 to face a bottom surface of the showerhead 210. The edge ring 102 is disposed around or surrounds a top portion 416 of the chuck 106.

Also, the plasma chamber 202 includes a coupling ring 410, which is located below the edge ring 102 and is disposed around or surrounds a bottom portion 418 of the chuck 106. For example, the coupling ring 410 is located adjacent to the edge ring 102. The bottom portion 418 is a portion next to and under the top portion 416. The coupling ring 410 is made from an electrical insulator material, e.g., a dielectric material, ceramic, glass, composite polymer, aluminum oxide, etc.

The plasma chamber 202 includes one or more insulator rings 412, which are disposed around or surround the edge ring 102 and the coupling ring 410. Each of the one or more insulator rings 412 are made from an electrical insulating material, such as quartz or another dielectric. Also, the plasma chamber 202 includes multiple ground rings 414 that surround a bottom portion of the one or more insulator rings 412. Each of the multiple ground rings 414 is made from a metal, such as aluminum or an alloy of aluminum.

Moreover, the plasma chamber 202 includes a cover ring 420, e.g., a quartz cover ring, a dielectric cover ring, etc., which is overlaid on top of the ground rings 414 to protect the ground rings 414 from RF power of the plasma generated within the gap 219. The cover ring 420 surrounds a top portion of the one or more insulator rings 412. The top portion of the one or more insulator rings 412 is on top of the bottom portion of the one or more insulator rings 412. The C-shroud 214 is disposed around or surrounds the cover ring 420, the upper electrode extension 212, and the gap 219.

During the PER WAC operation described above with reference to FIG. 1A or 1B or 2A-2E, the residue 402 that is deposited under and adjacent to the bottom surface 404 of the upper electrode extension 212 is cleaned, such as removed or reduced, by plasma within the gap 219. The plasma is generated within the gap 219 when RF power of the modified RF signal 134 is supplied to the edge ring 102 and the one or more process gases for the PER WAC operation are supplied to the plasma chamber 202.

In an embodiment, the upper electrode extension 212 is a part of the showerhead 210 and is located within the showerhead 210.

In one embodiment, instead of the C-shroud, confinement rings are used within the plasma chamber 202. For example, the confinement rings are disposed around or surround the upper electrode extension 212, the gap 219, and the cover ring 420 to enclose the gap 219.

In an embodiment, one or more insulator rings are located between the upper electrode 408 and the upper electrode extension 212. Similarly, in one embodiment, one or more insulator rings are disposed between the upper electrode extension 212 and the C-shroud 214.

Figure 5A:
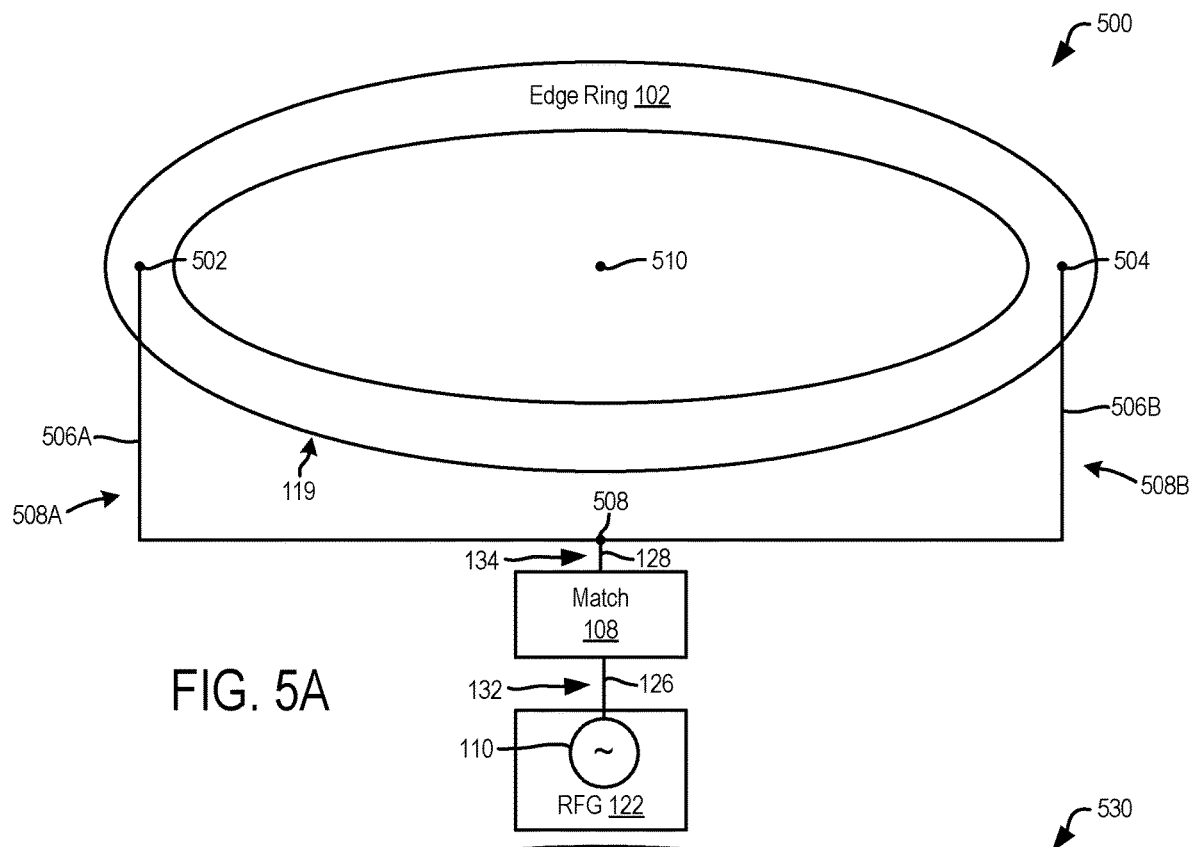
FIG. 5A is a diagram of an embodiment of a system to illustrate that the edge ring is provided RF power from a modified RF signal at two separate locations of the edge ring.

FIG. 5A is a diagram of an embodiment of a system 500 to illustrate that the edge ring 102 is provided RF power from the modified RF signal 134 at two separate locations 502 and 504 or regions or points. The location 502 is across from the location 504 and are symmetrically distributed across the bottom surface 119 of the edge ring 102. For example, the locations 502 and 504 are 180 degrees or approximately 180 degrees, such as between 175 degrees and 185 degrees, apart from each other as measured from a centroid 510 of the edge ring 102.

The RF connector 128 is coupled at a point 508 or a region or a location to two RF connectors 506A and 506B. An example of an RF connector includes a coaxial cable that is surrounded by a sleeve or a pin surrounded by a sleeve. The RF connector 506A is coupled to the location 502 at the bottom surface 119 of the edge ring 102 and the RF connector 506B is coupled to the location 504 at the bottom surface 119.

The modified RF signal 134 is split into two modified RF signals 508A and 508B at the point 508. RF power from the modified RF signal 508A is transferred via the RF connector 506A to the location 502 and RF power from the modified RF signal 508B is transferred via the RF connector 506B to the location 504. In this manner, RF power of the modified RF signal 134 is symmetrically or evenly distributed across the edge ring 102.

Figure 5B:
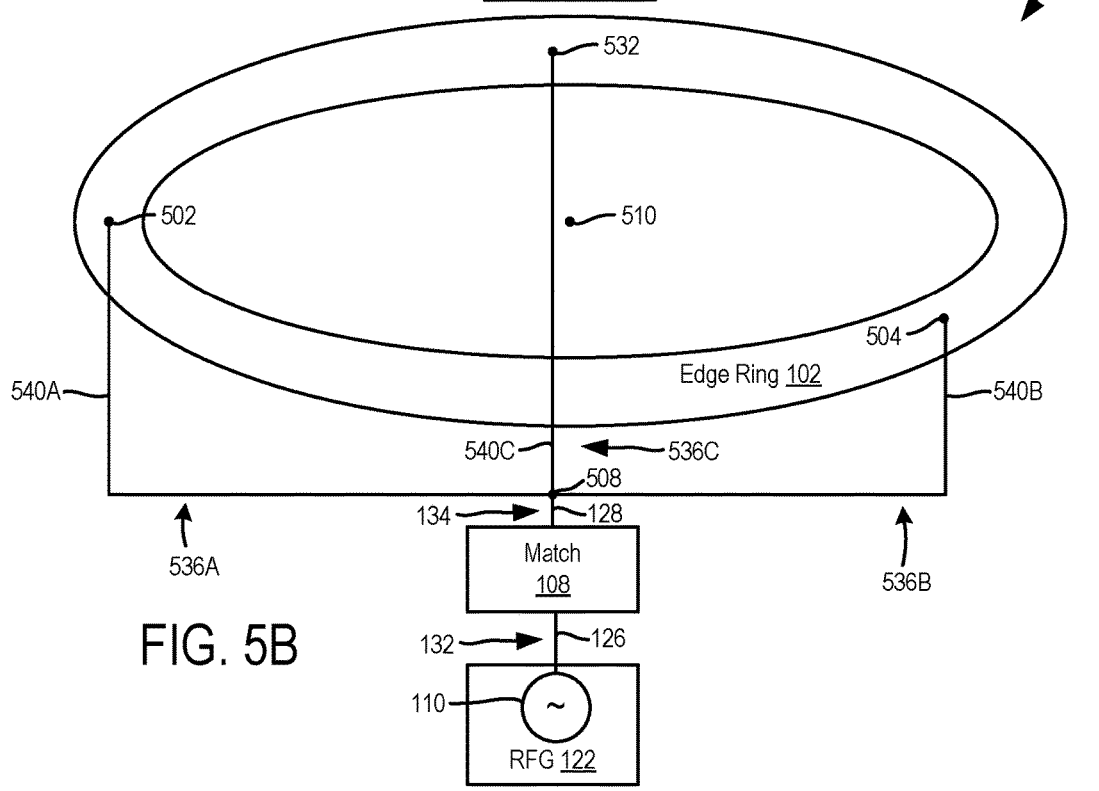
FIG. 5B is a diagram of an embodiment of a system to illustrate that the edge ring is provided RF power from a modified RF signal at three separate locations of the edge ring.

FIG. 5B is a diagram of an embodiment of a system 530 to illustrate that the edge ring 102 is provided RF power from the modified RF signal 134 at three separate locations 502, 532, and 534 or regions or points. The locations 502, 532, and 534 are symmetrically distributed across the bottom surface 119 of the edge ring 102. For example, any two adjacent ones of the locations 502, 532, and 534 are 60 degrees or approximately 60 degrees, such as between 55 degrees and 65 degrees, apart from each other as measured from the centroid 510 of the edge ring 102. To illustrate, the location 532 is 60 degrees or approximately 60 degrees apart from the location 502 and the location 534 is 60 degrees or approximately 60 degrees apart from the location 532.

The RF connector 128 is coupled at the point 508 or a region or a location to three RF connectors 540A, 540B, and 540C. The RF connector 540A is coupled to the location 504 at the bottom surface 119, the RF connector 540B is coupled to the location 534 at the bottom surface 119, the RF connector 540C is coupled to the location 534 at the bottom surface 119.

The modified RF signal 134 is split into three modified RF signals 536A, 536B, and 536C at the point 508. RF power from the modified RF signal 536A is transferred via the RF connector 540A to the location 502, RF power from the modified RF signal 536B is transferred via the RF connector 540B to the location 534, and RF power from the modified RF signal 536C is transferred via the RF connector 540C to the location 532. In this manner, RF power of the modified RF signal 134 is symmetrically or evenly distributed across the edge ring 102.

In an embodiment, the edge ring 102 receives RF power at any other number of locations, such as four or five or six, instead of two or three.

Figure 6A:
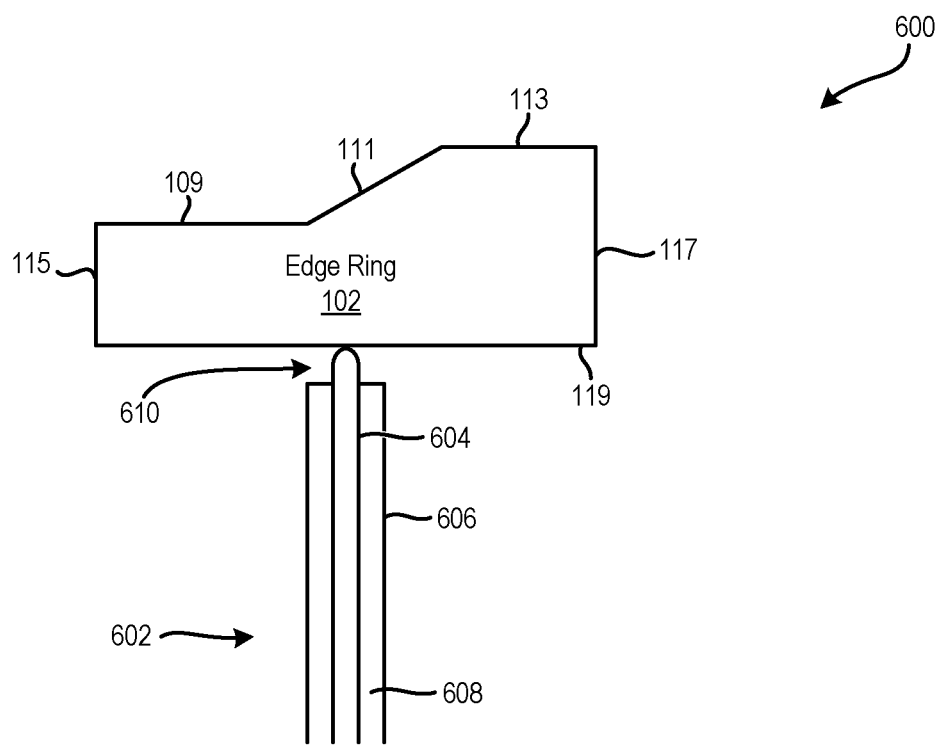
FIG. 6A is a diagram of an embodiment of a system to illustrate an RF connector.

FIG. 6A is a diagram of an embodiment of a system 600 to illustrate an RF connector 60, which is example of the RF connector 128 (FIG. 1A), or the RF connector 506A (FIG. 5A), or the RF connector 506B (FIG. 5A), or the RF connector 540A (FIG. 5B), or the RF connector 540B (FIG. 5B), or the RF connector 540C (FIG. 5B). The RF connector 602 includes a power pin 604 that is surrounded by a sleeve 606. The power pin 604 is made from a metal. An insulator 608 is between the power pin 604 and the sleeve 606. The power pin 604 is surrounded by the insulator 608, which is surrounded by the sleeve 606. The sleeve 606 covers the power pin 604 to insulate the power pin 604 from electrical fields surrounding the power pin 604. The sleeve 606 is made from an electrical insulator material, e.g., plastic, glass, a combination of plastic and glass, etc.

A tip 610 of the power pin 604 extends from the sleeve 606 to contact the bottom surface 119 of the edge ring 119. The tip 610 extends out of the sleeve 606. A modified RF signal, such as the modified RF signal 134 (FIG. 1A) or the modified RF signal 508A (FIG. 5A) or the modified RF signal 508B (FIG. 5A) or the modified RF signal 536A (FIG. 5B) or the modified RF signal 536B (FIG. 5B) or the modified RF signal 536C (FIG. 5B), is supplied via the power pin 604 to the bottom surface 119 of the edge ring 119 to provide RF power to the edge ring 119.

In one embodiment, instead of the power pin 604, a coaxial cable is used.

Figure 6B:
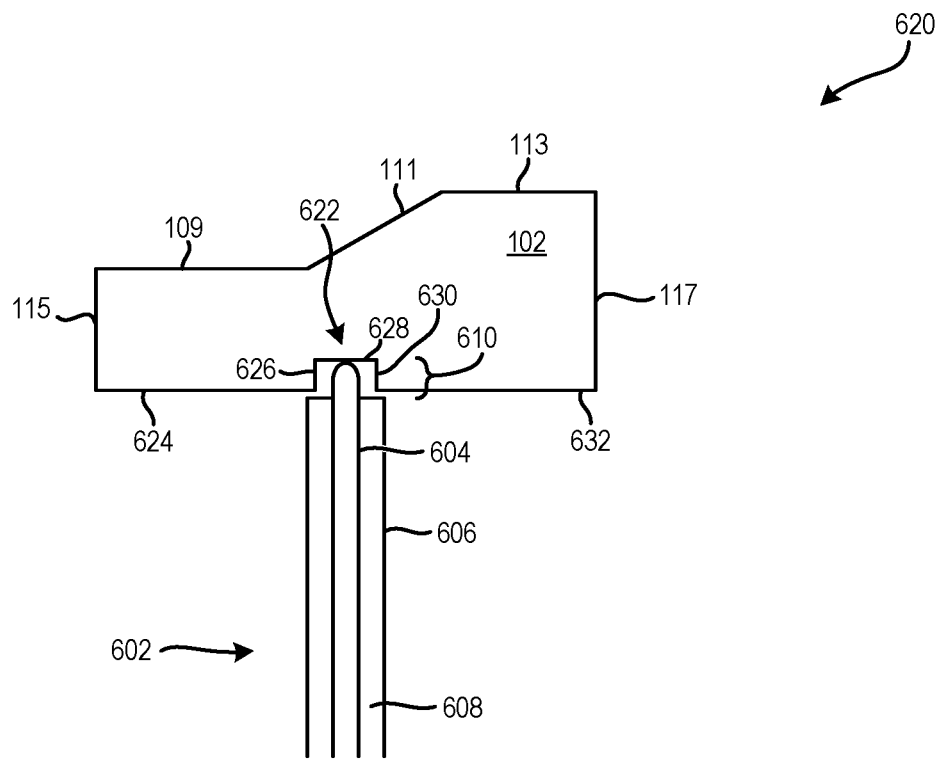
FIG. 6B is a diagram of an embodiment of a system to illustrate that a tip of an RF connector extends within a slot formed within a bottom surface of the edge ring.

FIG. 6B is a diagram of an embodiment of a system 610 to illustrate that the tip 610 extends within a slot 622 or a groove or a notch formed within the bottom surface 119 (FIG. 6A) of the edge ring 102. The slot 622 is formed within the bottom surface 119 to form an inner bottom surface 624 of the edge ring 102, a vertical surface 626 of the edge ring 102, a horizontal surface 628 of the edge ring 102, a vertical surface 630 of the edge ring 102, and an outer bottom surface 632 of the edge ring 102.

The vertical surface 626 is perpendicular or substantially perpendicular with respect to the inner bottom surface 624. Moreover, the horizontal surface 628 is perpendicular or substantially perpendicular with respect to the vertical surface 626. Also, the vertical surface 630 is perpendicular or substantially perpendicular with respect to the horizontal surface 628. The outer bottom surface 632 is perpendicular or substantially perpendicular with respect to the vertical surface 630. As an example, a surface that forms an angle between 85 and 95 degrees with respect to another surface is substantially perpendicular to the other surface. The horizontal surface 628 is at a level above a level of the inner bottom surface 624 and of the outer bottom surface 632 but below a level of the inner top surface portion 109.

The vertical surface 626 is adjacent to the inner bottom surface 624 and the horizontal surface 628 is adjacent to the vertical surface 626. Also, the vertical surface 630 is adjacent to the horizontal surface 628, and the outer bottom surface 632 is adjacent to the vertical surface 630. The slot 622 is surrounded on three sides by the vertical surface 626, the horizontal surface 628, and the vertical surface 630.

The tip 610 extends into the slot 610 to contact the horizontal surface 628. For example, a level of the tip 610 is above the level of the inner bottom surface 624 and the outer bottom surface 632 to connect to the horizontal surface 628 to provide RF power to the edge ring 102.

In one embodiment the slot 622 is semi-circular shaped or has a polygonal shape or has a triangular shape or has a dome shape. For example, instead of the vertical surfaces 626 and 630 and the horizontal surface 628, a dome-shaped groove is formed within the bottom wall 119 of the edge ring 102.

Figure 7A:
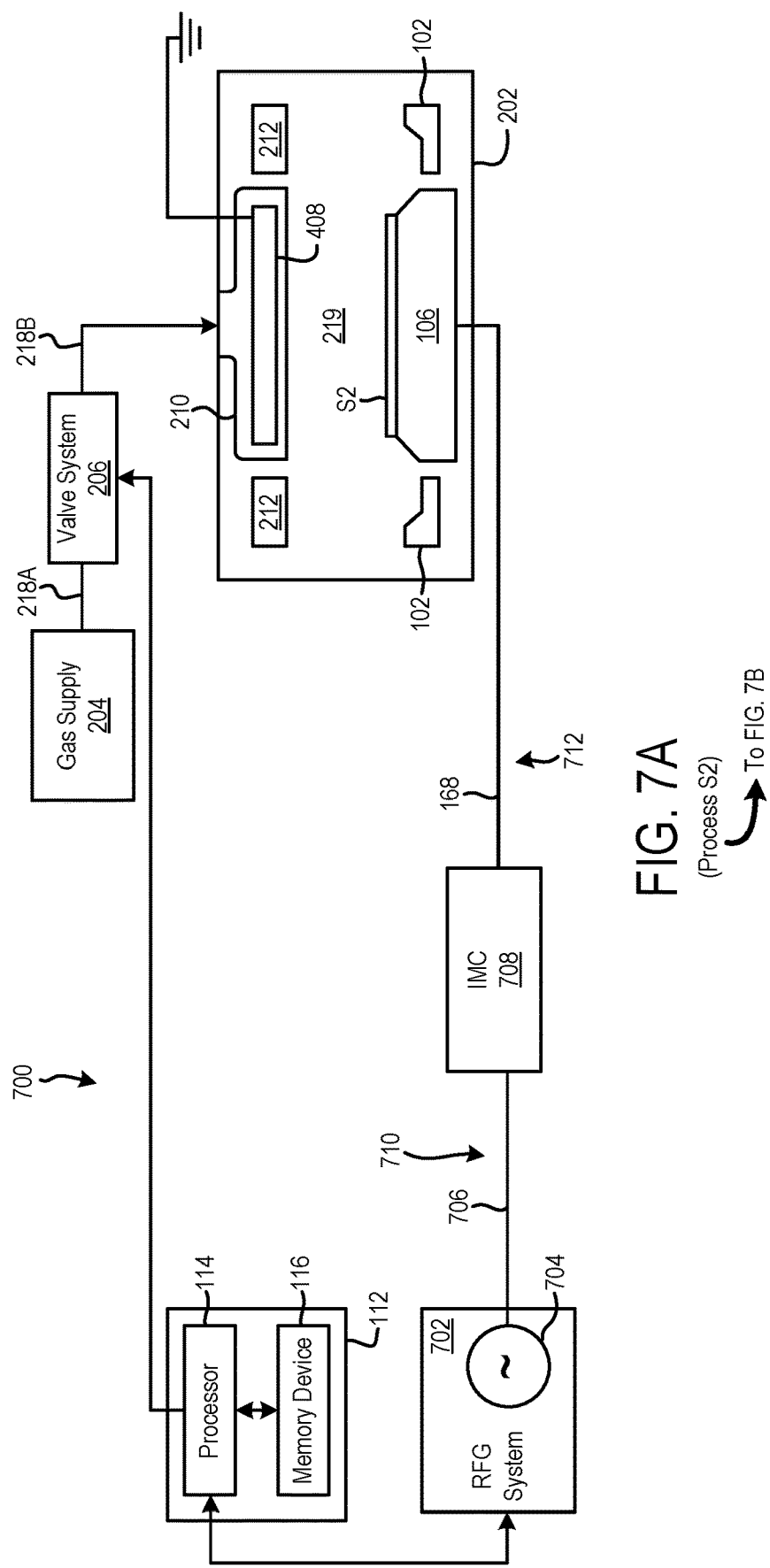
FIG. 7A is a diagram of an embodiment of a system to illustrate processing of a substrate.

FIG. 7A is a diagram of an embodiment of a system 700 to illustrate processing of a substrate S2. Unlike the substrate S1 (FIG. 3A), the substrate S2 is a silicon wafer that is to be processed, such as etched or to be deposited with materials or sputtered or cleaned. For example, one or more integrated circuits are to be fabricated on the substrate S2 and there is no fabrication of an integrated circuit on the substrate S1.

The system 700 includes an RF generator system 702, an impedance matching circuit 708, the host computing device 112, the gas supply 204, the valve system 206, and the plasma chamber 202. The RF generator system 702 includes one or more RF generators, such as the RF generator 152 (FIG. 2D). For example, the RF generator system 702 includes an RF generator that has an operational frequency of 2 MHz, another RF generator that has an operational frequency of 27 MHz, and the RF generator 152. As another example, the RF generator system 702 includes an RF generator that has an operational frequency of 2 MHz and another RF generator that has an operational frequency of 27 MHz. As yet another example, the RF generator system 702 includes an RF generator that has an operational frequency of 400 kHz, another RF generator that has an operational frequency of 2 MHz, and the RF generator 152.

Each RF generator of the RF generator system 702 includes an RF power supply. As such, the RF generator system 702 includes one or more RF power supplies 704. The one or more power supplies 704 of the RF generator system 702 are coupled via an RF cable system 706 to the impedance matching circuit 708. For example, each power supply of the one or more RF power supplies 704 is coupled via a respective RF cable to a respective input of the impedance matching circuit 708. To illustrate, a first RF power supply of the one or more RF power supplies 704 is coupled via a first RF cable to a first input of the impedance matching circuit 708, a second RF power supply of the one or more RF power supplies 704 is coupled via a second RF cable to a second input of the impedance matching circuit 708, and a third RF power supply of the one or more RF power supplies 704 is coupled via a third RF cable to a third input of the impedance matching circuit 708.

An output of the impedance matching circuit 708 is coupled via the RF transmission line 168 to the lower electrode of the chuck 106. Also, the processor 114 is coupled via one or more connection cables to the one or more RF generators of the RF generator system 702. For example, the processor 114 is coupled via a first connection cable to a first RF generator of the RF generator system 702, is coupled via a second connection cable to a second RF generator of the RF generator system 702, and is coupled via a third connection cable to a third RF generator of the RF generator system 702.

To process the substrate S2, the processor 114 controls the valve system 206 so that one or more process gases for processing the substrate S2 are supplied via the portion 218A of the gas line system, the valve system 206, and the portion 218B to the showerhead 210. Examples of the one or more process gases for processing the substrate S2 or another substrate, such as S3, described below, include an oxygen-containing gas, such as $O_2$. Other examples of the one or more process gases for processing the substrates S2 and S3 include a fluorine-containing gas, such as, tetrafluoromethane ($CF_4$), sulfur hexafluoride ($SF_6$), and hexafluoroethane ($C_2F_6$).

Also, to process the substrate S2, the processor 114 provides values of the parameters, such as frequency and power, for each of the one or more RF generators of the RF generator system 704 via the one or more connection cables. Upon receiving the parameters, the one or more RF generators of the RF generator system 702 generates one or more RF signals 710. For example, the one or more RF power supplies 704 generates and supplies the one or more RF signals 710. To illustrate, the first RF power supply generates and supplies a first RF signal, the second RF power supply generates and supplies a second RF signal, and the third RF power supply generates and supplies a third RF signal.

The one or more RF signals 710 are transferred via the one or more RF cables 706 to the one or more inputs of the impedance matching circuit 708. For example, the first RF signal is transferred via the first RF cable to the first input of the impedance matching circuit 708, the second RF signal is transferred via the second RF cable to the second input of the impedance matching circuit 708, and the third RF signal is transferred via the third RF cable to the third input of the impedance matching circuit 708.

The impedance matching circuit 708 receives the one or more RF signals 710 and matches an impedance of a load coupled to the output of the impedance matching circuit 708 with an impedance of a source coupled to the one or more inputs of the impedance matching circuit 708 to output a modified RF signal 712. For example, the impedance matching circuit 708 receives the first RF signal via the first RF cable and the impedance matching circuit 708, receives the second RF signal via the second RF cable and the impedance matching circuit 708, and receives the third RF signal via the third RF cable and the impedance matching circuit 708, and combines the first, second, and third RF signals, modifies an impedance of the first RF signal, an impedance of the second RF signal, and an impedance of the third RF signal, and combines the first, second, and third RF signals at the output of the impedance matching circuit 708. The first RF signal passes via a first branch circuit of the impedance matching circuit 708, the second RF signal passes via a second branch circuit of the impedance matching circuit 708, and the third RF signal passes via a third branch circuit of the impedance matching circuit 708. An example of the load coupled to the output of the impedance matching circuit 708 includes the plasma chamber 202 and the RF transmission line 168 and an example of a source coupled to the input of the impedance matching circuit 708 includes the RF generator system 702 and the one or more RF cables 706.

The modified RF signal 712 is transferred via the RF transmission line 168 to the lower electrode of the chuck 106. When the modified RF signal 712 and the one or more process gases for processing the substrate S2 are supplied to the plasma chamber 202, plasma is stricken within the gap 219 to process the substrate S2. It should be noted that during processing of the substrate S2, the upper electrode 408 is coupled to a ground potential. During an end of processing the substrate S2, the processor 114 controls the valve system 206 to turn off the supply or flow of the one or more process gases for processing the substrate S2 and controls the RFG system 702 to stop the supply of the one or more RF signals 710. Also, once the substrate S2 is processed, the substrate S2 is removed from the plasma chamber 202 via an opening, such as a slot, that extends through the side wall SW of the plasma chamber 202.

In one embodiment, instead of being coupled to the ground potential, the upper electrode 408 receives a modified RF signal from an output of an impedance matching circuit. The impedance matching circuit is coupled via one or more RF cables to receive one or more RF signals from one or more RF generators.

In an embodiment, both the upper electrode extension 212 and the edge ring 102 are coupled to the ground potential during processing of the substrate S2.

In an embodiment, values of the parameters that are provided from the processor 114 to the RF generator system 702 during the processing of a substrate are different from values of the parameters that are provided from the processor 114 to the RF generator 122 (FIG. 2A) and from values of the parameters that are provided from the processor 114 to the RF generator 152 (FIG. 2B) during the cleaning operation for removing or reducing the residue within the edge ring pocket 130 and the gap 138. For example, a greater power level is provided from the processor 114 to the RF generator system 702 to generate an RF signal having the greater power level. The power level is greater than a power level that is provided from the processor 114 to the RF generator 152 (FIG. 2A) and/or a power level that is provided from the processor 114 to the RF generator 122. As another example, a lower power level is provided from the processor 114 to the RF generator system 702 to generate an RF signal having the lower power level. The power level is less than a power level that is provided from the processor 114 to the RF generator 152 (FIG. 2A) and/or a power level that is provided from the processor 114 to the RF generator 122.

Figure 7B:
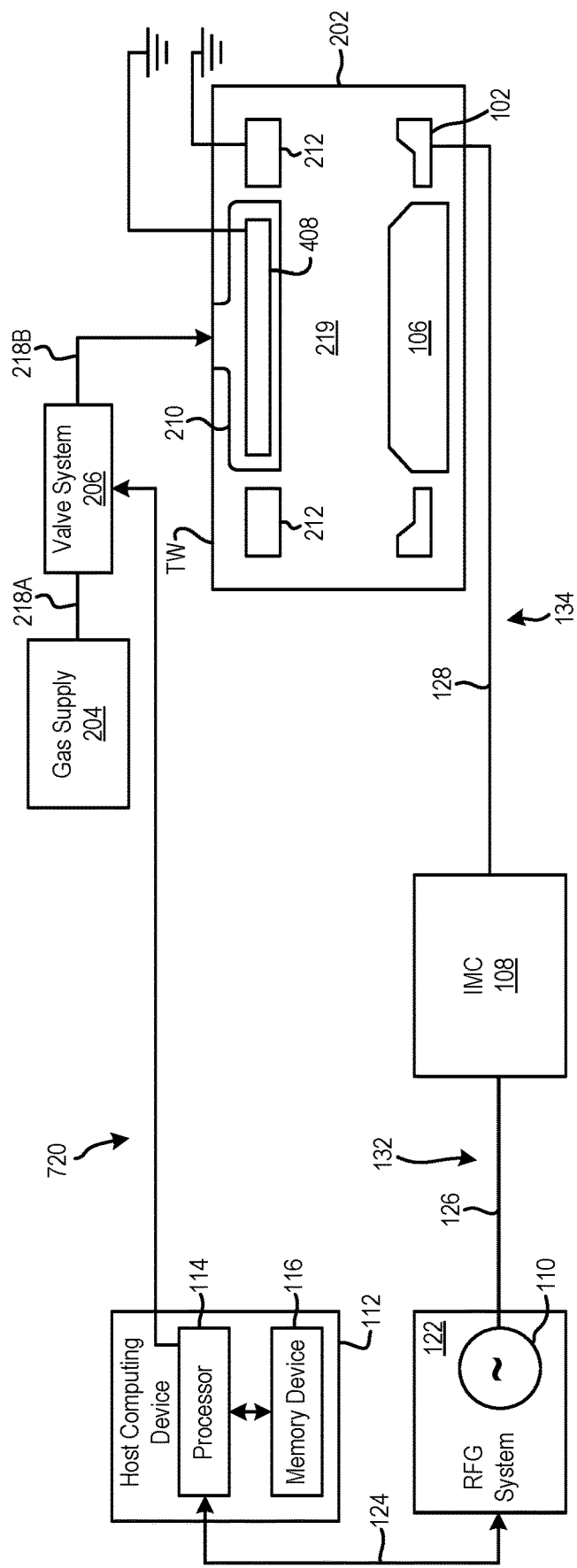
FIG. 7B is a diagram of an embodiment of a system to illustrate cleaning of the edge ring after processing the substrate using the method described above with reference to FIG. 7A.

FIG. 7B is a diagram of an embodiment of a system 720 to illustrate cleaning of edge ring 102 after processing the substrate S2 using the method described above with reference to FIG. 7A. The edge ring 102 is cleaned when the residue within the edge ring pocket 130 and/or the residue within the gap 138 (FIG. 1C) is removed or reduced. The system 720 includes the host computing device 112, the RF generator 122, the impedance matching circuit 108, the plasma chamber 122, the gas supply 204, and the valve system 206.

After the substrate S2 is processed using the method illustrated above with reference to FIG. 7A, the residue within the edge ring pocket 130 and the gap 138 (FIG. 1C) is removed or reduced. For example, the PER WAC operation that is illustrated above with reference to FIG. 1A or FIG. 1B or FIGS. 2A-2E is performed. To illustrate, the processor 114 controls the valve system 206 so that the one or more process gases for removing or reducing the residue within the edge ring pocket 130 and the gap 138 (FIG. 1C) are supplied via the portion 218A of the gas line system, the valve system 206, and the portion 218B of the gas line system to the showerhead 210. To further illustrate, the processor 114 controls the one or more valves of the valve system 206 to open to supply the one or more process gases for removing or reducing the residue within the edge ring pocket 130 and the gap 138 via the portion 218A of the gas line system, the valve system 206, and the portion 218B of the gas line system to the one or more zones of the showerhead 210 (FIG. 2A). As another example, the CWAC and PER WAC operations described above with reference to FIG. 3A is performed. As yet another example, the CWAC operation and the pins-up auto clean operation described above with reference to FIG. 3B or FIG. 3C are performed. During the process of removing or reducing the residue within the edge ring pocket 130 and the gap 138 (FIG. 1C), the upper electrode extension 212 is coupled to the ground potential and the upper electrode 408 is coupled to the ground potential.

In one embodiment, during the process of removing or reducing the residue within the edge ring pocket 130 and the gap 138 (FIG. 1C), instead of being coupled to the ground potential, the upper electrode extension 212 is receives a modified RF signal from an output of an impedance matching circuit. The impedance matching circuit is coupled via one or more RF cables to receive one or more RF signals from one or more RF generators.

In an embodiment, during the process of removing or reducing the residue within the edge ring pocket 130 and the gap 138 (FIG. 1C), instead of being coupled to the ground potential, the upper electrode 408 is receives a modified RF signal from an output of an impedance matching circuit. The impedance matching circuit is coupled via one or more RF cables to receive one or more RF signals from one or more RF generators.

Figure 7C:
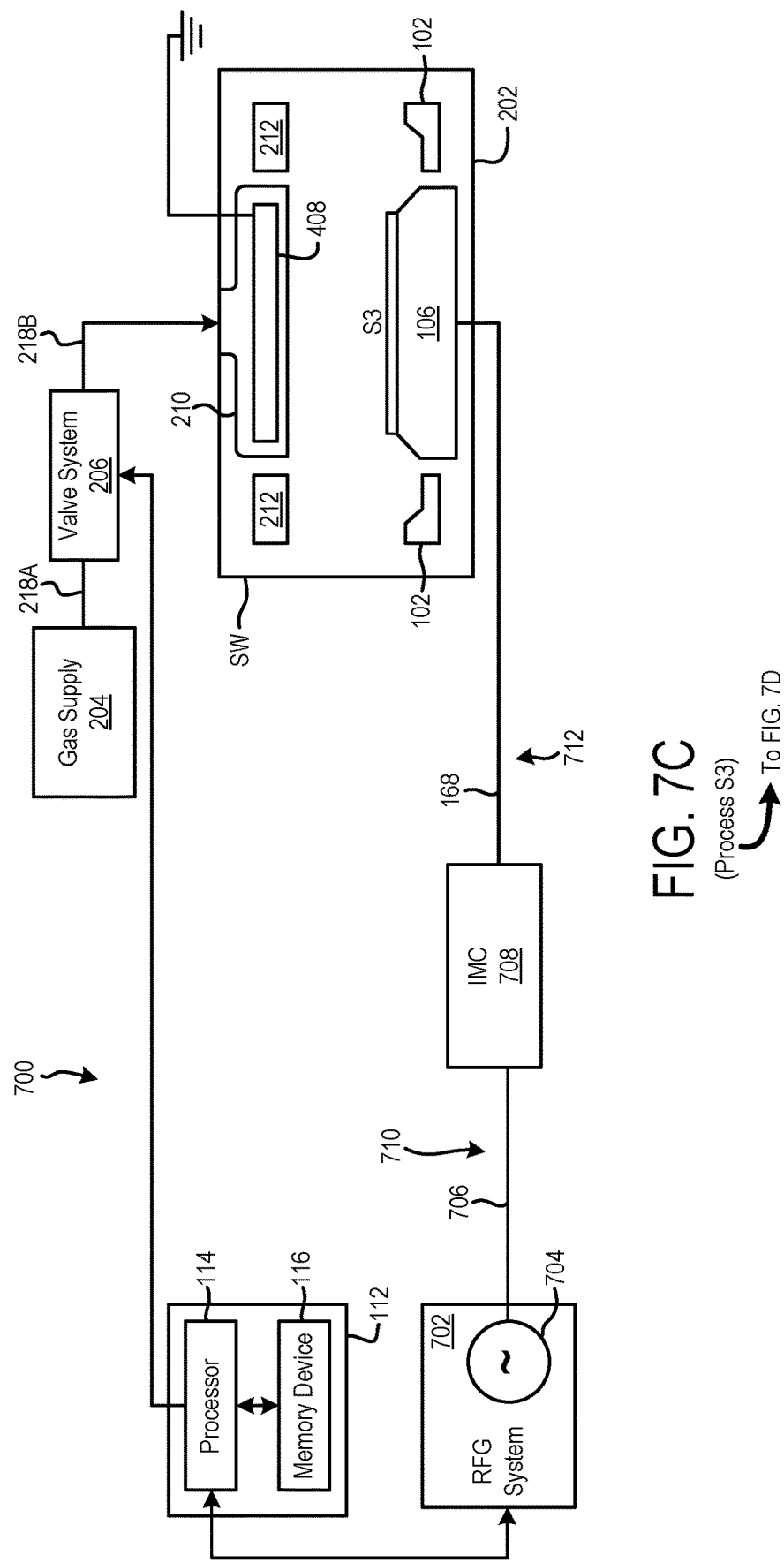
FIG. 7C is a diagram of an embodiment of a system to illustrate processing of another substrate after performing the cleaning operation described above with reference to FIG. 7B.

FIG. 7C is a diagram of an embodiment of the system 700 to illustrate processing of the substrate S3 after performing the cleaning operation described above with reference to FIG. 7B. The substrate S3 is similar to the substrate S2 in that the substrate S3 is not a dummy substrate but is a substrate on which one or more integrated circuits are to be fabricated. The substrate S3 is inserted into the plasma chamber 202 via the opening in the side wall SW of the plasma chamber 202. The processor 114 controls the valve system 206 and the RF generator system 702 to process the substrate S3 in the same manner in which the processor 114 controls the valve system 206 and the RF generator system 702 to process the substrate S2 (FIG. 7A). For example, the one or more process gases are supplied to the showerhead 210 and the modified RF signal 712 is supplied to the lower electrode of the chuck 106 to process the substrate S3.

Figure 7D:
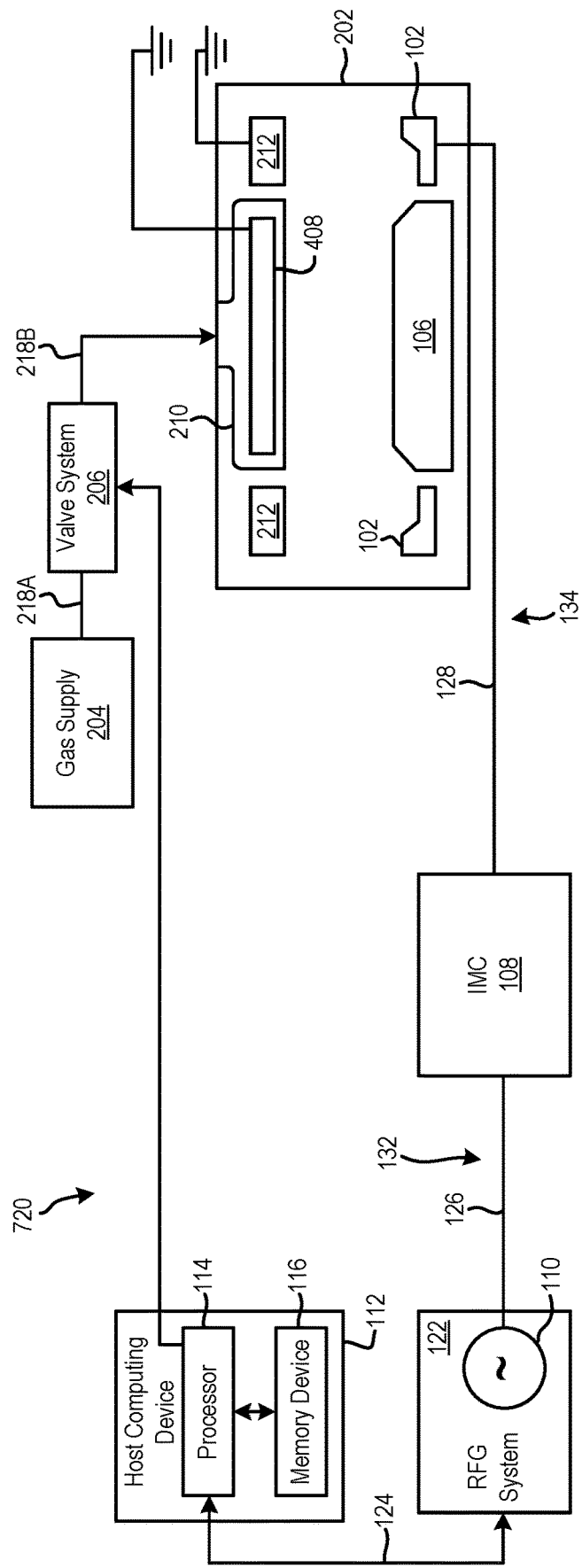
FIG. 7D is a diagram of an embodiment of a system to illustrate cleaning of residue on a surface of the edge ring after processing the other substrate.

FIG. 7D is a diagram of an embodiment of the system 720 to illustrate cleaning of the residue from the edge ring pocket 130 and the gap 138. The operation of cleaning the residue of the edge ring pocket 130 and the gap 138 (FIG. 3A) is performed after processing the substrate S3 using the method described above with reference to FIG. 7C. The operation of cleaning is performed in the same manner as that described above with reference to FIG. 7B.

By cleaning the residue from the edge ring pocket 130 and the gap 138 (FIG. 3A), mean time between clean (MTBC) increases. For example, there is no need to open the top wall TW or a top cover of the plasma chamber 202 to clean the components of the plasma chamber 202. To illustrate, approximately 400 RF hours of processing operations that are described above with reference to FIGS. 7A and 7C can be performed before opening the plasma chamber 202 to clean the components.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHz RF generator, a Y MHz RF generator, and a Z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for cleaning an edge ring pocket, comprising:
   providing one or more process gases to a plasma chamber; and
   supplying a low frequency (LF) radio frequency (RF) power to an edge ring that is located adjacent to a chuck of the plasma chamber, wherein a portion of the edge ring pocket is defined by a top surface of the edge ring,
   wherein said supplying the LF RF power is performed while the one or more process gases are supplied to the plasma chamber to maintain plasma within the plasma chamber, wherein said supplying the LF RF power is performed during a time period in which RF power is not supplied to the chuck,
   wherein said supplying the LF RF power energizes plasma ions in the plasma to remove residue in the edge ring pocket,
   wherein said supplying the LF RF power is performed during the time period in which a substrate is not being processed within the plasma chamber.

2. The method of claim 1, wherein the one or more process gases includes oxygen, or nitrogen, or argon, or carbon dioxide, or hydrogen, or a fluorine-based gas, or a combination of two or more thereof.

3. The method of claim 2, wherein the one or more process gases include two or more process gases, wherein an amount of the fluorine-based gas ranges from and including 0.5% of a total amount of the two or more process gases and 15% of the total amount.

4. The method of claim 1, wherein the low frequency is 400 kilohertz or 2 megahertz (MHz) or 13.56 MHz or 27 MHz.

5. The method of claim 1, wherein the top surface of the edge ring includes an inner top surface portion, an angled top surface portion, and an outer top surface portion, wherein the edge ring has an inner side surface, an outer side surface, and a bottom surface, wherein the inner top surface portion of the edge ring is adjacent to the inner side surface, the angled top surface portion is adjacent to the inner top surface portion, the outer top surface portion is adjacent to the angled top surface portion, the outer side surface is adjacent to the outer top surface portion, the bottom surface is adjacent to the outer side surface portion, and the inner side surface is adjacent to the bottom surface.

6. The method of claim 5, wherein the chuck has a top surface, an angled surface, and a side surface, wherein the edge ring pocket extends between the top surface of the chuck and the outer top surface portion of the edge ring.

7. The method of claim 6, wherein the side surface of the chuck and the inner side surface of the edge ring forms a gap therebetween, wherein the edge ring pocket extends from the top surface of the chuck via a region on top of the angled surface of the chuck, a region on top of the gap, a region on top of the inner top surface portion of the edge ring, and a region on top of the angled surface portion of the edge ring to the outer top surface portion of the edge ring.

8. The method of claim 1, wherein there is a lack of one or more rings between the edge ring and the chuck for the edge ring to be located adjacent to the chuck.

9. The method of claim 1, wherein said providing the one or more process gases is initiated before said supplying the LF RF power to the edge ring, wherein said providing the one or more process gases continues during said supplying the LF RF power to the edge ring.

10. The method of claim 1, wherein said providing the one or more process gases is performed to achieve a steady state of pressure within the plasma chamber.

11. The method of claim 1, further comprising:
    ramping down the LF RF power supplied to the edge ring;
    discontinuing said providing the one or more gases after said ramping down of the LF RF power.

12. The method of claim 1, wherein said providing the one or more process gases and said supplying the LF RF power to the edge ring are portions of a powered edge ring waferless auto clean (PER WAC) process, the method further comprising executing a covered wafer auto clean operation before executing said PER WAC process.

13. The method of claim 1, further comprising:
    executing a covered wafer auto clean operation before said providing the one or more process gases and said supplying the LF RF power to the edge ring, wherein said covered wafer auto clean operation is performed by placing a dummy substrate on top of the chuck; and
    lifting the dummy substrate, wherein said providing the one or more gases and supplying the LF RF power are performed after lifting the dummy substrate.

14. The method of claim 1, wherein said providing the one or more process gases and said supplying the LF RF power are performed to reduce residue at a bottom surface of an upper edge electrode of the plasma chamber.

15. A method for cleaning an edge ring pocket, comprising:
    providing one or more process gases to a plasma chamber;
    supplying a low frequency (LF) radio frequency (RF) power to an edge ring that is located adjacent to a chuck of the plasma chamber, wherein a portion of the edge ring pocket is defined by a top surface of the edge ring; and
    supplying high frequency (HF) RF power to the chuck;
    wherein said supplying the LF RF power and said supplying the HF RF power are performed while the one or more process gases are supplied to the plasma chamber to maintain plasma within the plasma chamber, wherein said supplying the LF RF power energizes plasma ions in the plasma to remove residue in the edge ring pocket, wherein said supplying the LF RF power and said supplying the HF RF power are performed during a time interval in which a substrate is not being processed within the plasma chamber.

16. The method of claim 15, further comprising executing a covered wafer auto clean operation before said providing the one or more process gases, said supplying the LF RF power to the edge ring, and said supplying the HF RF power to the chuck.

17. The method of claim 15, wherein said providing the one or more process gases is initiated before said supplying the LF RF power to the edge ring and said supplying the HF RF power to the chuck, wherein said providing the one or more process gases continues during said supplying the LF RF power to the edge ring and said supplying the HF RF power to the chuck.

18. The method of claim 15, further comprising:
ramping down the LF RF power supplied to the edge ring;
ramping down the HF RF power supplied to the chuck;
discontinuing said providing the one or more gases after said ramping down of the LF RF power and said ramping down the HF RF power to the chuck.

19. A method for cleaning an edge ring pocket, comprising:
providing one or more process gases to a plasma chamber;
supplying a low frequency (LF) radio frequency (RF) power to an edge ring that is located adjacent to a chuck of the plasma chamber, wherein a portion of the edge ring pocket is defined by a top surface of the edge ring;
supplying high frequency (HF) RF power to the chuck for a pre-determined portion of a time period during which the LF RF power is supplied to the edge ring; and
wherein said supplying the LF RF power is performed while the one or more process gases are supplied to the plasma chamber to maintain plasma within the plasma chamber,
wherein said supplying the LF RF power energizes plasma ions in the plasma to remove residue in the edge ring pocket,
wherein said supplying the LF RF power is performed during the time period in which a substrate is not being processed within the plasma chamber.

20. The method of claim 19, further comprising:
discontinuing said supplying the HF RF power to the chuck after the pre-determined portion of the time period, wherein said supplying the LF RF power to the edge ring continues after said supplying of the HF RF power is discontinued.

* * * * *